(12) United States Patent
Otomo

(10) Patent No.: US 7,257,184 B2
(45) Date of Patent: Aug. 14, 2007

(54) PHASE COMPARATOR, CLOCK DATA RECOVERY CIRCUIT AND TRANSCEIVER CIRCUIT

(75) Inventor: Yusuke Otomo, Tokyo (JP)

(73) Assignee: NTT Electronics Corporation, Tokyo (JP)

(*) Notice: Subject to any disclaimer, the term of this patent is extended or adjusted under 35 U.S.C. 154(b) by 708 days.

(21) Appl. No.: 10/391,298

(22) Filed: Mar. 19, 2003

(65) Prior Publication Data
US 2003/0223527 A1 Dec. 4, 2003

(30) Foreign Application Priority Data
May 30, 2002 (JP) ............... 2002-158045
Aug. 23, 2002 (JP) ............... 2002-243347

(51) Int. Cl.
*H03D 3/24* (2006.01)

(52) U.S. Cl. .................................................. 375/376

(58) Field of Classification Search ................. 375/374, 375/375, 373, 371, 354, 376, 377, 316, 224, 375/226, 228; 455/130, 149; 370/518, 517, 370/516, 503, 498, 464
See application file for complete search history.

(56) References Cited

U.S. PATENT DOCUMENTS

| | | | |
|---|---|---|---|
| 5,022,057 A | 6/1991 | Nishi et al. | |
| 5,301,196 A | 4/1994 | Ewen et al. | |
| 5,359,298 A * | 10/1994 | Abe | 331/2 |
| 5,428,648 A * | 6/1995 | Fukuda | 375/371 |
| 5,799,048 A | 8/1998 | Farjad-Rad et al. | |
| 6,771,728 B1 | 8/2004 | Abernathy | |
| 2001/0031028 A1 | 10/2001 | Vaucher | |

OTHER PUBLICATIONS

J. Lee et al., "A 40Gb/s Clock and Data Recovery Circuit in 0.18 μm CMOS Technology" IEEE International Solid-State Circuits Conference, Feb. 11, 2003, pp. 242-243.
J. Savoj et al., "A 10-Gb/s CMOS Clock and Data Recovery Circuit with a Half-Rate Linear Phase Detector", IEEE Journal of Solid-State Circuits, vol. 36, No. 5, May 2001, pp. 761-768.

* cited by examiner

*Primary Examiner*—Pankaj Kumar
(74) *Attorney, Agent, or Firm*—Rothwell, Figg, Ernst and Manbeck, P.C.

(57) ABSTRACT

A phase comparator comprises a latch unit for latching the input data signal in parallel on rising/falling edges of the respective clock signals respectively, an error signal output unit for outputting m error signals respectively indicative of differences in phase between the transient edge of the input data signal and the transient edges of the respective clock signals and each having a minimum pulse width of $(m/2-1) \times T$ or more, based on respective output signals produced from the latch unit and the respective clock signals, an input unit for inputting the respective output signals produced from the latch unit in parallel on the rising/falling edges of the respective clock signals and a reference signal output unit for outputting m reference signals whose pulse widths are $(m/2) \times T$, based on output signals produced from the input unit and the respective clock signals.

10 Claims, 8 Drawing Sheets

PHASE COMPARATOR, CLOCK DATA RECOVERY CIRCUIT AND TRANSCEIVER CIRCUIT

BACKGROUND OF THE INVENTION

1. Field of the Invention

The present invention relates to a phase comparator for comparing difference in phase between a transient edge of an input data signal and transient edges of clock signals, a clock data recovery (hereinafter abbreviated as "CDR") circuit for adjusting the differences in phase, and a transceiver circuit using the phase comparator.

2. Background Art

FIG. 1 shows a block diagram of a conventional CDR circuit. In FIG. 1, reference numeral 130 indicates the conventional CDR circuit, and reference numeral 131 indicates an input terminal of an input data signal Din. Reference numeral 133 indicates a phase comparator for inputting the input data signal Din inputted from the input terminal 131 and a clock signal ckv outputted from a voltage controlled oscillator (VCO) to be described later to thereby compare the phases thereof, or a phase detector (PD) or a phase frequency detector (PFD) for detecting the difference in phase therebetween (the circuit designated at numeral 133 will hereinafter be called "phase detector PD"). Subsequently, reference numeral 135 indicates a charging pump (CP) which inputs a reference signal (Ref) and an error signal (Error) outputted from the phase detector PD (133) and thereby outputs a charge current and a discharge current, and reference numeral 137 indicates a loop filter (shown around by a broken line) which is made up of a resistor R3 (139), a capacitor C2 (141), and a resistor R4 (143) connected in series and takes out a dc component from the charge current or the discharge current outputted from the charging pump CP (135). The loop filter 137 averages the charge current or the discharge current on a time basis and represents the averaged one as the difference in potential between vcont+ and vcont−. Reference numeral 145 indicates a double/single-phase voltage converter (DSC) for converting the difference in potential between vcont+ and vcont− taken out from the loop filter 137 to a desired voltage vcont, and reference numeral 147 indicates a voltage controlled oscillator VCO for outputting the clock signal ckv according to the desired voltage vcont outputted from the double/single-phase voltage controller DSC (145) and receiving it as the input of the phase detector PD (133).

While the output of the charging pump 135 is a differential signal and the loop filter 137 also shows a differential configuration, a configuration using a single-phase output charging pump and a single-phase loop filter is also normally adopted. In the case of the single-phase configuration, a circuit such as a voltage follower circuit or the like is used without using the double/single-phase voltage converter 145.

The operation of the CDR circuit 130 will next be described. As shown in FIG. 1, the conventional CDR circuit 130 is a circuit which causes the input data signal Din (whose frequency f/2 Hz or bit rate f bits/sec) inputted from the input terminal 131 and the clock signal ckv outputted from the voltage controlled oscillator VCO (147) to coincide in frequency and phase with each other. Namely, the CDR circuit 130 performs the operation of feeding back the difference in phase between the input data signal Din and the clock signal ckv to its corresponding oscillation frequency of the voltage controlled oscillator VCO (147) and allowing the phase of the clock signal ckv to coincide with that of the input data signal Din. The CDR circuit 130 is brought to a lock state in which both signals coincide with each other when the rising edge of the clock signal ckv is placed in the center (time equivalent to one-half a cycle or period T) of a time width (cycle T=1/f) of the input data signal Din. In the lock state, latches 150, 151, 152, 153 (shown in FIG. 2) lying inside the phase detector PD (133) latch and shape the input data signal Din according to the clock signal ckv and output two output signals. One of the two output signals is corresponding to even (odd) number of the input data signal Din and the output signal q3 of latch 152 from an output terminal 148 as a Dout 1 signal corresponding to the output of the CDR circuit 130. Another one of the two output signals is corresponding to odd (even) number of the input data signal Din and the output signal q4 of latch 153 from an output terminal 146 as a Dout 2 signal corresponding to the output of the CDR circuit 130. The clock signal ckv is outputted from an output terminal 149 as a Ckout signal.

The conventional phase detector PD (133) for detecting the difference in phase between the input data signal Din and the clock signal ckv is a circuit for outputting an error signal (Error) and a reference signal (Ref) and setting the difference between pulse widths of the two signals as the phase difference referred to above.

FIG. 2 shows a block diagram of the conventional phase detector PD (133). In FIG. 2, reference numeral 154 indicates an input terminal of an input data signal Din, reference numeral 155 indicates an input terminal of a clock signal ckv, reference numerals 150, 151, 152 and 153 indicate latches $L_1$, $L_2$, $L_3$ and $L_4$ respectively having D terminals of their data inputs, C terminals of their clock inputs and Q outputs, reference numerals 156 and 157 indicate exclusive-OR circuits, reference numeral 160 indicates an output terminal of an error signal (Error), and reference numeral 161 indicates an output terminal of a reference signal (Ref), respectively.

The latch $L_1$ (150) latches the input data signal Din inputted to the D terminal on the rising edge of the clock signal ckv inputted to the C terminal and outputs the Din to the Q output ($q_1$). While the clock signal ckv inputted to the C terminal is High (logical 1), the latch $L_1$ (150) holds the Q output ($q_1$) as it is. On the other hand, the latch $L_1$ (150) outputs the input data signal Din to the Q output ($q_1$) as it is while the clock signal ckv inputted to the C terminal is Low (logical 0). Accordingly, when the input data signal Din changes while the clock signal ckv inputted to the C terminal is Low (logical 0), the Q output ($q_1$) also changes according to its change.

The latch $L_2$ (151) latches the input data signal Din inputted to the D terminal on the falling edge of the clock signal ckv inputted to the C terminal and outputs the Din to the Q output ($q_2$). While the clock signal ckv inputted to the C terminal is Low (logical 0), the latch $L_2$ (151) holds the Q output ($q_2$) as it is. On the other hand, the latch $L_2$ (151) outputs the input data signal Din to the Q output ($q_2$) as it is while the clock signal ckv inputted to the C terminal is High (logical 1). Thus, when the input data signal Din changes while the clock signal ckv inputted to the C terminal is High (logical 1), the Q output ($q_2$) also changes according to its change.

The Q output ($q_1$) of the latch $L_1$ (150) and the Q output ($q_2$) of the latch $L_2$ (151) are inputted to the exclusive-OR circuit 156. An output $q_1$ xor $q_2$ (where "xor" means XORing (exclusive OR) of $q_1$ and $q_2$. This is hereinafter similar.) thereof is outputted from the output terminal 160 as the error signal (Error).

The latch $L_3$ (152) latches the Q output ($q_1$) inputted to the D terminal on the falling edge of the clock signal ckv inputted to the C terminal and outputs it to the Q output ($q_3$). While the clock signal ckv inputted to the C terminal is Low (logical 0), the latch $L_3$ (152) holds the Q output ($q_3$) as it is. On the other hand, the latch $L_3$ (152) outputs the input Q output ($q_1$) to the Q output ($q_3$) as it is while the clock signal ckv inputted to the C terminal is High (logical 1).

The latch $L_4$ (153) latches the Q output ($q_2$) inputted to the D terminal on the rising edge of the clock signal ckv inputted to the C terminal and outputs it to the Q output ($q_4$). While the clock signal ckv inputted to the C terminal is High (logical 1), the latch $L_4$ (153) holds the Q output ($q_4$) as it is. On the other hand, the latch $L_4$ (153) outputs the input Q output ($q_2$) to the Q output ($q_4$) as it is while the clock signal ckv inputted to the C terminal is Low (logical 0).

The Q output ($q_3$) of the latch $L_3$ (152) and the Q output ($q_4$) of the latch $L_4$ (153) are inputted to the exclusive-OR circuit 157. An output $q_3$ xor $q_4$ thereof is outputted from the output terminal 161 as the reference signal (Ref).

FIGS. 3(A) through 3(H) show a time chart of the conventional phase detector PD (133) shown in FIG. 2. Since spots or parts marked with the same reference numerals as those shown in FIG. 2 indicate the same parts in FIGS. 3(A) through 3(H), their description will be omitted. A signal shown in FIG. 3(A) shows that the name thereof indicates the input data signal Din and the speed thereof (the fastest speed expressed in Hz conversion and similar subsequently) is expressed in f/2 (data period or cycle is given by T (=1/f)). The signal is expressed in the form of data 0, data 1, etc. for each cycle T. A signal shown in FIG. 3(B) indicates that the name thereof is represented as the clock signal ckv, the speed thereof is expressed in f/2, and the input data signal Din rises during the data 0 and falls during the data 1. A signal shown in FIG. 3(C) indicates that the name thereof is represented as the output $q_1$ of the latch $L_1$ (150), a fetch edge at the D terminal of the latch $L_1$ (150) is indicative of the rising edge (as indicated as ↑CK) of the clock signal ckv, and the speed thereof is expressed in f/2. A signal shown in FIG. 3(D) indicates that the name thereof is represented as the output $q_2$ of the latch $L_2$ (151), a fetch edge at the D terminal of the latch $L_2$ (151) is indicative of the falling edge (as indicated as ↓CK) of the clock signal ckv, and the speed thereof is expressed in f/2. A signal shown in FIG. 3(E) indicates that the name thereof is represented as the error signal (Error) of the exclusive-OR circuit 156, a logical expression indicative of the output of the exclusive-OR circuit 156 is expressed in $q_1$ xor $q_2$, and the speed thereof is f.

A signal shown in FIG. 3(F) indicates that the name thereof is represented as the output $q_3$ of the latch $L_3$ (152), a fetch edge at the D terminal of the latch $L_3$ (152) is indicative of the falling edge (as indicated as ↓CK) of the clock signal ckv, and the speed thereof is expressed in f/4. A signal shown in FIG. 3(G) indicates that the name thereof is represented as the output $q_4$ of the latch $L_4$ (153), a fetch edge at the D terminal of the latch $L_4$ (153) is indicative of the rising edge (as indicated as ↑CK) of the clock signal ckv, and the speed thereof is expressed in f/4. A signal shown in FIG. 3(H) indicates that the name thereof is represented as the reference signal (Ref) of the exclusive-OR circuit 157, a logical expression indicative of the output of the exclusive-OR circuit 157 is expressed in $q_3$ xor $q_4$, and the speed thereof is f/2.

As shown in FIGS. 3(A) through 3(C), the latch $L_1$ (150) takes in or captures the input data signal Din (data 0) on the rising edge of the clock signal ckv and outputs it to the $q_1$ output thereof. Since the clock signal ckv is High even if the input data signal transitions from the data 0 to the data 1, the $q_1$ output holds the data 0. While the clock signal ckv is held Low, the data 1 of the input data signal appears at the output $q_1$ as it is. When the input data signal Din transitions to the data 2, the data 2 appears at the output $q_1$ as it is. Next, when the clock signal ckv rises while the input data signal Din is of the data 2, the latch $L_1$ (150) takes in the data 2 and outputs it to the $q_1$ output. Since the clock signal ckv is High even if the input data signal transitions from the data 2 to the data 3, the $q_1$ output holds the data 2. Since such a process is similar subsequently, the description thereof will be omitted.

As shown in FIGS. 3(A), 3(B) and 3(D), the latch $L_2$ (151) takes in the input data signal Din (data 1) on the falling edge of the clock signal ckv and outputs it to the $q_2$ output thereof. Since the clock signal ckv is Low even if the input data signal transitions from the data 1 to the data 2, the $q_2$ output holds the data 1. While the clock signal ckv is held High, the data 2 of the input data signal Din appears at the output $q_2$ as it is. When the input data signal Din is caused to transition to the data 3, the data 3 appears at the output $q_2$ as it is. Next, when the clock signal ckv falls while the input data signal Din is of the data 3, the latch $L_2$ (151) takes in the data 3 and outputs it to the $q_2$ output. Since the clock signal ckv is Low even if the input data signal transitions from the data 3 to the data 4, the $q_2$ output holds the data 3. Since this is similar subsequently, the description thereof will be omitted.

When the output $q_1$ is of the data 0 and the output $q_2$ is of the data 1 as shown in FIGS. 3(C) through 3(E), the output of the error signal (Error) results in "(data 0) xor (data 1)" (hereinafter abbreviated as "0xor1"). Next, when the output $q_1$ is of the data 1 and the output $q_2$ is also of the data 1, the output of the error signal (Error) becomes "1xor1"=0. In FIG. 3(E), the output of the error signal (Error), which apparently reaches 0, is represented as the logical 0, and the output thereof which does not reach 0, is represented as a pulse like "0xor1".

As shown in FIGS. 3(A), 3(B) and 3(E), when the input data signal Din is transitioned, the error signal (Error) is outputted as a pulse with the difference in time between a transient edge of the input data signal Din and the rising (or falling) edge of the clock signal ckv as a pulse width. Namely, when a position relationship (=±0.5×T) in which the rising (falling) edge of the clock signal ckv is placed in the center of the input data signal Din, is taken, the pulse width of the error signal (Error) results in ½ (=0.5×T) of the pulse width of the reference signal (Ref).

As shown in FIGS. 3(B), 3(C) and 3(F), the latch $L_3$ (152) takes in the output $q_1$ (data 0) on the falling edge of the clock signal ckv and outputs it to the $q_3$ output thereof. Since the clock signal ckv is Low even if the output $q_1$ transitions from the data 1 to the data 2, the $q_3$ output holds the data 0. While the clock signal ckv is held High, the data 2 of the output $q_2$ appears at the output $q_3$ as it is. Next, when the clock signal ckv falls, the latch $L_3$ (152) takes in the data 2 at the output $q_2$ and outputs it to the $q_3$ output. Since the clock signal ckv is Low even if the output $q_2$ transitions from the data 3 to the data 4, the $q_3$ output holds the data 2. Since this is similar subsequently, the description thereof will be omitted.

As shown in FIGS. 3(B), 3(D) and 3(G), the latch $L_4$ (153) takes in the output $q_2$ (data 1) on the rising edge of the clock signal ckv and outputs it to the $q_4$ output thereof. Since the clock signal ckv is High even if the output $q_2$ transitions from the data 2 to the data 3, the $q_4$ output holds the data 1. While the clock signal ckv is held Low, the data 3 of the output q2 appears at the output $q_4$ as it is. Next, when the clock signal ckv rises, the latch $L_4$ (153) takes in the data 3 at the output $q_2$ and outputs it to the $q_4$ output. Since the clock signal ckv is High even if the output $q_2$ transitions from the data 4 to the data 5, the $q_4$ output holds the data 3. Since this is similar subsequently, the description thereof will be omitted.

When the output $q_3$ is of the data 0 and the output $q_4$ is of the data 1 as shown in FIGS. 3(F) through 3(H), the output of the reference signal (Ref) results in "0xor1". Next, when the output $q_3$ is of the data 2 and the output $q_4$ is of the data 1, the output of the reference signal (Ref) becomes "2xor1" (or "1xor2"). In FIGS. 3(A) and 3(H), the reference signal (Ref) is always outputted as a pulse having a length width ($=1.0 \times T$) of the data cycle T where the input data signal Din has transitioned.

Thus, when the rising edge of the clock signal ckv is placed forward by $\Delta t$ from the center of the input data signal Din, the error signal (Error) reduced by $\Delta t$ in pulse width with respect to the pulse width ($=0.5 \times T$) equal to one-half the reference signal (Ref) is outputted. On the other hand, when the rising edge of the clock signal ckv is placed backward by $\Delta t$ from the center of the input data signal Din, the error signal (Error) whose pulse width is increased by $\Delta t$ with respect to the pulse width ($=0.5 \times T$) equal to one-half the reference signal (Ref), is outputted. Thus, the pulse width of the error signal (Error) results in $0.5 \times T \pm 0.5 \times T$.

SUMMARY OF THE INVENTION

In the conventional phase detector PD (133) as described above, the error signal (Error) has taken the time width between the transient edge of the input data signal Din and the transient edge of the following clock signal ckv as the pulse according to the XORing of the outputs $q_1$ and $q_2$. Therefore, when one cycle of the input data signal Din is T (second) and the speed thereof is f/2 (Hz. It is converted in clock expression) as shown in FIG. 3 by way of example, the pulse width of the error signal (Error) might be $0.5 \times T$ or less. In the case of frequency conversion, it might be f (Hz) or faster. Thus, the conventional phase detector PD (133) is accompanied by a problem that since the error signal (Error) become high-speed pulses respectively, there is a need to provide devices each operable at a speed equal to twice the speed of the input data signal Din with a view toward realizing the conventional phase detector PD (133).

In the conventional phase detector PD (133), the speeds of the error signal (Error), reference signal (Ref) and clock signal ckv could not be reduced to a desired speed respectively. Namely, the conventional phase detector PD (133) has a problem in that since only the exclusive-OR circuit 156 with the outputs of the latches $L_1$ (150) and $L_2$ (151) as the inputs produces the error signal (Error), and only the exclusive-OR circuit 157 with the outputs of the latches $L_3$ (152) and $L_4$ (153) as the inputs produces the reference signal (Ref), the operating speed of the phase detector PD (133) cannot be changed flexibly according to speed characteristics of each device to be used.

In the conventional CDR circuit 130, there may be cases in which the pulse width of the error signal (Error) corresponding to the output of the phase comparator CP (133) reaches $0.5 \times T$ or less, and the error signal (Error) and the reference signal (Ref) are brought to high-speed pulses respectively. As a result, a problem arises in that the phase detector PD (133) and the charging pump CP 135 are rate-controlled in response and hence the whole CDR circuit 130 cannot be operated fastest.

Thus, the present invention has been made to solve the foregoing problems. An object of the present invention is to provide a phase comparator capable of flexibly changing its operating speed according to speed characteristics of each used device without the need for each device operable at a speed equal to twice the speed of an input data signal Din for the purpose of realizing the phase comparator, and a transceiver circuit using the phase comparator.

Another object of the present invention is to provide a CDR circuit for causing a phase detector PD to detect the difference in phase between a data input signal Din and a clock signal ckv and feeding back the phase difference to each oscillation frequency of a voltage controlled oscillator VCO to allow the phase of the clock signal ckv to coincide with that of the input data signal Din, thereby enabling a fastest operation without bringing an error signal (Error) and a reference signal (Ref) corresponding to the outputs of the phase detector PD to high-speed pulses respectively.

According to one aspect of the present invention, a phase comparator compares differences in phase between a transient edge of an input data signal and transient edges of clock signals. The input data signal has a cycle of T. The clock signals are m clock signals whose frequencies are expressed in f/m (where $f=1/T$, and $m=2^n$ (where n: whole number greater than or equal to 2)) and whose phases are different $2\pi/m$ by $2\pi/m$. The phase comparator comprises a latch unit, an error signal, an input unit and a reference signal output unit. The latch unit latches the input data signal in parallel on rising edges of the respective clock signals respectively. The error signal output unit outputs m error signals respectively indicative of differences in phase between the transient edge of the input data signal and the transient edges of the respective clock signals and each has a minimum pulse width of $(m/2-1) \times T$ or more, based on respective output signals produced from the latch unit and the respective clock signals. The input unit inputs the respective output signals produced from the latch unit in parallel on the rising edges of the respective clock signals. The reference signal output unit outputs m reference signals whose pulse widths are $(m/2) \times T$, based on output signals produced from the input unit and the respective clock signals.

Other and further objects, features and advantages of the invention will appear more fully from the following description.

DETAILED DESCRIPTION OF THE PREFERRED EMBODIMENT

Figure 1:
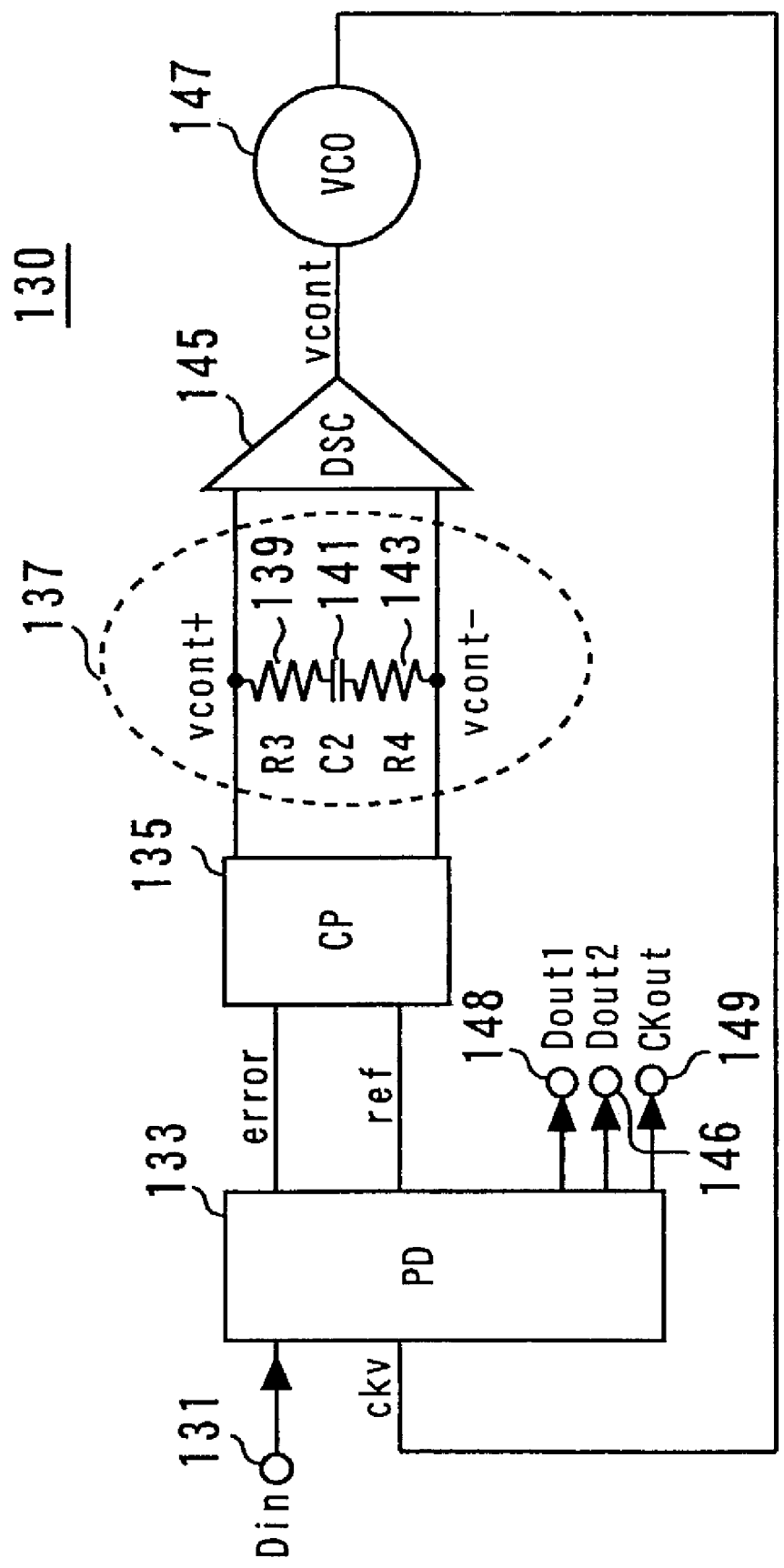
FIG. 1 shows a block diagram of a conventional CDR circuit.
Figure 2:
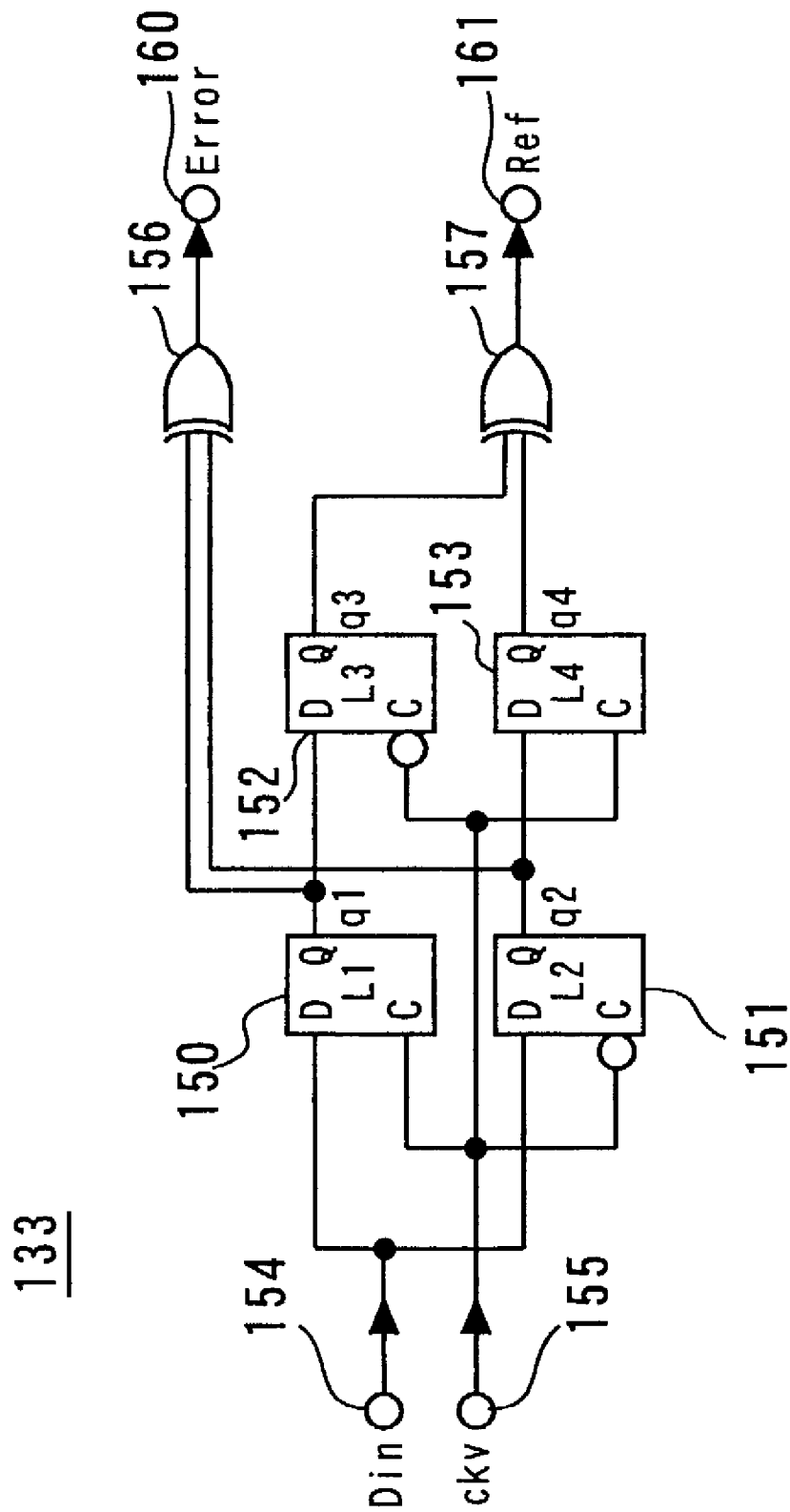
FIG. 2 shows a block diagram of the conventional phase detector PD.
Figure 3:
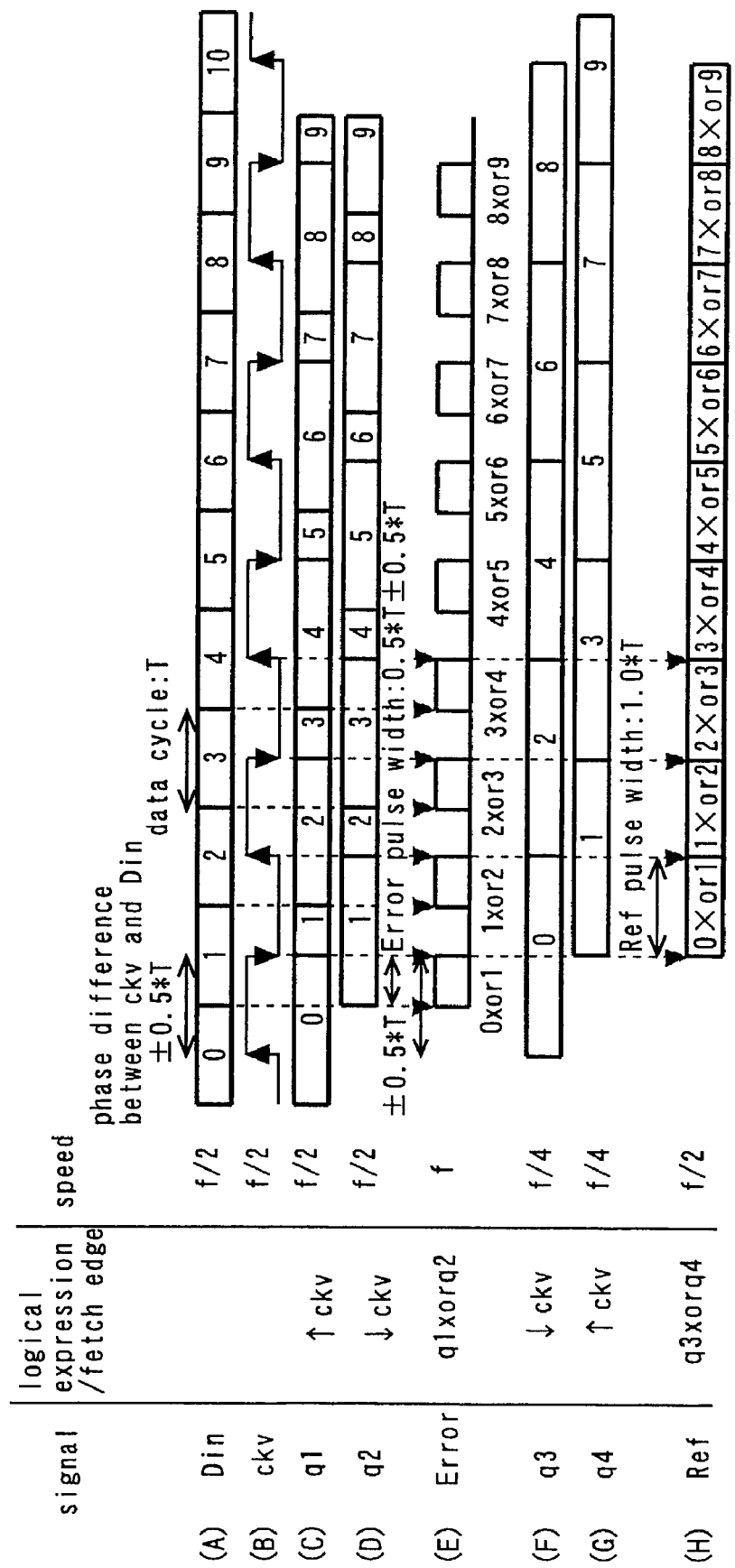
FIG. 3 shows a time chart of the conventional phase detector PD shown in FIG. 2.
Figure 4:
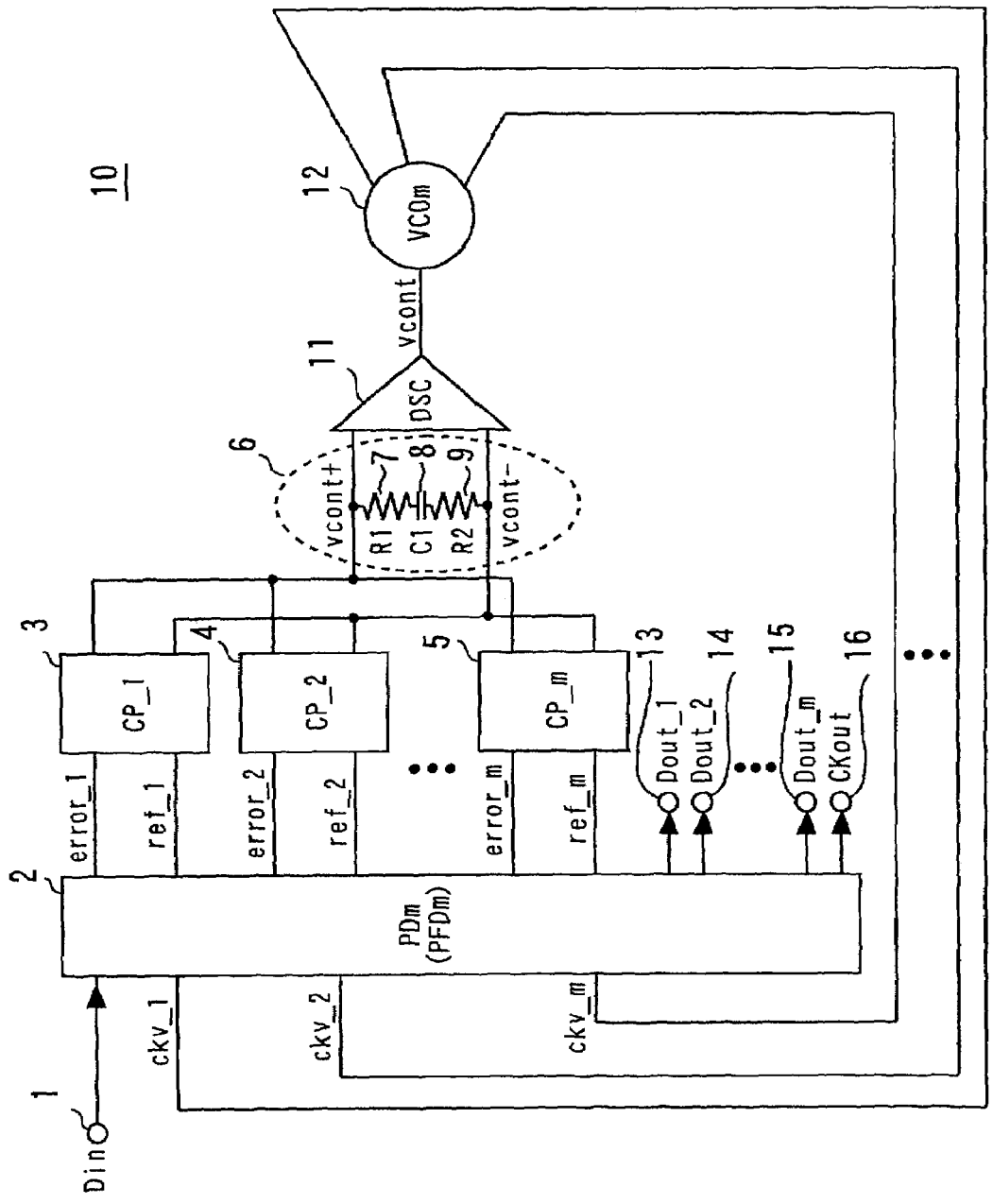
FIG. 4 is a block diagram of a CDR circuit according to an embodiment of the present invention.

FIG. 4 is a block diagram of a CDR circuit according to an embodiment of the present invention. In FIG. 4, reference numeral 10 indicates the CDR circuit according to the embodiment of the present invention, which causes the differences in phase between an input data signal and clock signals to coincide with one another, and reference numeral 1 indicates an input terminal for the input data signal Din (cycle T). Reference numeral 2 indicates a phase detector PDm (or PFDm) inputted with the input data signal Din and m clock signals ckv_k (where k=1~m). The phase detector PDm (2) outputs m error signals (error_k) (where k=1~m) respectively indicative of differences in phase between a transient edge of the input data signal Din and transient edges of the respective clock signals ckv_k (where k=1~m) and each having a minimum pulse width of (m/2−1)×T or more, and outputs m reference signals (or phase comparison reference signals) ref_k (where k=1~m) each having a pulse width of (m/2)×T. Now, the clock signals ckv_k (where k=1~m) are m clock signals whose frequencies are given by f/m (where f=1/T, and m=$2^n$ (where n: whole number greater than or equal to 2)) and whose phases are different 2π/m by 2π/m. When the phase detector PDm (2) is brought to a predetermined lock state, it outputs m data signals Dout_k (where k=1~m) obtained by subjecting predetermined shape processing to the input data signal Din from output terminals designated at numerals 13 through 15 and outputs a clock signal ckvout from an output terminal 16.

Referring subsequently to FIG. 4, reference numeral 3 indicates a charging pump CP_1 which inputs a predetermined one error signal (error_1) of the m error signals (error_k) (where k=1~m) outputted from the phase detector PDm (2) and a predetermined one phase comparison reference signal (Ref)_1 of the m phase comparison reference signals ref_k (where k=1~m), and thereby outputs a charge current or a discharge current therefrom. In a manner similar to the charging pump CP_1 (3), a charging pump CP_2 (4) inputs an error signal (error_2 and a phase comparison reference signal (Ref)_2 and thereby outputs a charge current or a discharge current. Similarly, a charging pump CP_m (5) inputs an error signal (error_m and a phase comparison reference signal (Ref)_m and thereby outputs a charge current or a discharge current. The m charging pump CP_1 (3) through CP_m (5) constitute a charging pump group.

In FIG. 4, reference numeral 6 indicates a loop filter (indicated around by a broke line) which is commonly connected to the m respective charging pumps CP_k (where k=1~m) of the charging pump group and which averages charge currents or discharge currents outputted from the charging pump group on a time basis to thereby output a dc voltage component. The loop filter 6 comprises a resistor R1 (7), a capacitor C1 (8) and a resistor R2 (9) connected in series. The charge currents or the discharge currents are averaged on a time basis, which result is in turn expressed as the difference in potential between vcont+ and vcont−. Reference numeral 11 indicates a double/single-phase voltage converter (DSC) which converts the difference in potential between vcont+ and vcont− taken out by the loop filter 6 to a predetermined voltage vcont, and reference numeral 12 indicates a voltage controlled oscillator VCOm which inputs the predetermined voltage vcont outputted from the double/single-phase voltage converter DSC (11) and generates the m clock signals ckv_k (where k=1~m). The voltage controlled oscillator VCOm (12) outputs the generated m clock signals ckv_k (where k=1~m) to the phase detector PDm (2).

While a description has been made of the case in which the charging pumps and the loop filter respectively make use of a differential type and the double/single-phase voltage converter is used, it is needless to say that the charging pumps and the loop filter are capable of using a single-phase type respectively, and a voltage follower circuit or the like can be used as an alternative to the double/single-phase voltage converter.

The operation of the CDR circuit 10 according to the embodiment of the present invention will next be described. As shown in FIG. 4, the CDR circuit 10 is a circuit which causes an input data signal Din (whose frequency f/2 Hz or bit rate f bits/sec) inputted from the input terminal 1 and m clock signals ckv_k (where k=1~m) outputted from the voltage controlled oscillator VCOm (12), whose frequencies are represented as f/m (where f=1/T, m=$2^n$ (where n: whole number greater than or equal to 2)) and which are different in phase 2π/m by 2π/m, to coincide in phase with one another. The CDR circuit 10 performs the operation of feeding back the differences in phase between the input data signal Din and the clock signals ckv_k (where k=1~m) to oscillation frequencies of the voltage controlled oscillator VCOm (12) and allowing the phases of the clock signals ckv_k (where k=1~m) to coincide with that of the input data signal Din. In a lock state, flip-flops (shown in FIG. 5 to be described later) lying inside the phase detector PDm (2) latch and shape the input data signal Din according to the clock signals ckv_k (where k=1~m) and output the so-processed signals from the output terminals 13 through 15 as Dout_k (where k=1~m) corresponding to outputs of the CDR circuit 10. A clock signal ckvout, for example, ckv_1 is outputted from the output terminal 16 so that a circuit next to the CDR circuit 10 easily latches Dout_k. No delay circuit is shown here, but it is easy to insert some delay circuits in suitable positions for increasing the interfacing margin. Using the m clock signals ckv_k (where k=1~m) whose frequencies are expressed in f/m (Hz) and whose phases are different 2π/m by 2π/m, in the above-described manner makes it possible to reduce the velocities of error signals (error_k) (where k=1~m) corresponding to phase comparison signals to 2×f/m (Hz) slower than the conventional 2×f (Hz. frequency conversion). This effect serves proportionally even in regard to phase comparison reference signals ref_k (where k=1~m).

As shown in FIG. 4, the phase detector PDm (2) outputs the error signals (error_k) (where k=1~m) corresponding to the phase comparison signals and the phase comparison reference signals ref_k (where k=1~m). The error signals (error_k) (where k=1~m) and the phase comparison reference signals ref_k (where k=1~m) are inputted to the charging pumps CP_k (where k=1~m) of the charging pump group one by one. When the charging pumps CP_k (where k=1~m) are taken as one circuit, they operate in a manner similar to the conventional charging pump CP (135). However, the ratio of each charge current to each discharge current can be suitably changed. The charge and discharge currents of the charging pumps CP_k (where k=1~m) are averaged on a time basis by the loop filter 6 commonly connected thereto. Therefore, m phase information (error signals (error_k) or phase comparison reference signals ref_k, k=1~m) outputted from the phase detector PDm (2) are averaged on a time basis by the loop filter 6 through the charging pumps CP_k (where k=1~m), which result appears as the different in potential between vcont+ and vcont−. In a manner similar to the double/single-phase voltage converter DSC (145) in the conventional CDR circuit 130, the double/single-phase voltage converter DSC (11) converts the difference in potential between vcont+ and vcont− to a predetermined voltage, e.g., a potential vcont as measured from GND and feeds back it to each oscillation frequency of the voltage controlled oscillator VCOm (12). With its feedback, the CDR circuit 10 according to the embodiment of the present invention is operated in such a manner that the frequencies or phases of the oscillation clock signals ckv_k (where k=1~m) of the voltage controlled oscillator VCOm (12) coincide with the phase of the input data signal Din corresponding to the input of the CDR circuit 10.

Figure 5:
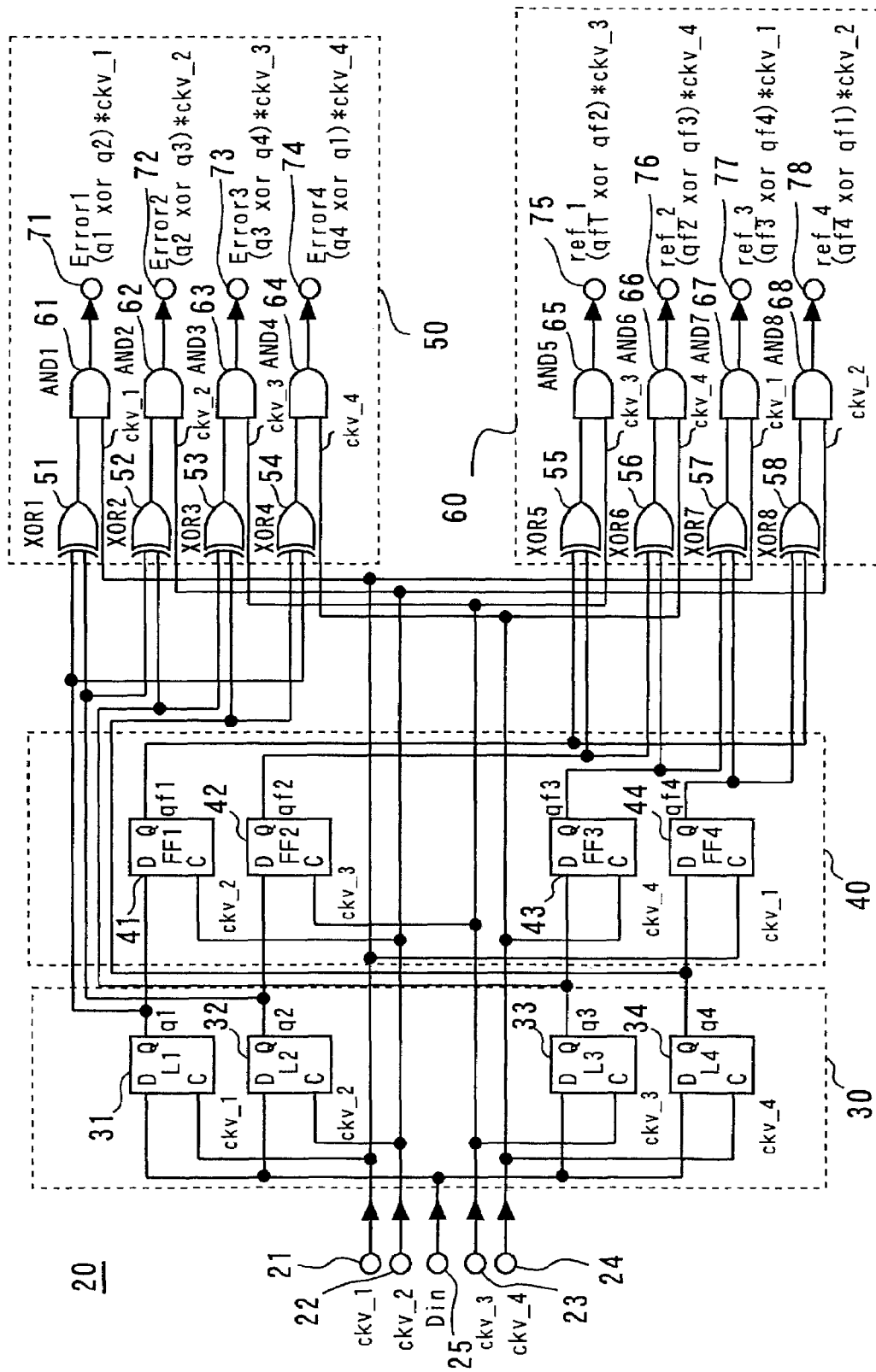
FIG. 5 shows one example of the phase detector PDm (where m=4) of the present invention in the form of a block diagram.

FIG. 5 shows one example of the phase detector PDm (2) (where m=4) of the present invention in the form of a block diagram. In the present example, m=$2^n$ and n is a whole number greater than or equal to 2. FIG. 5 illustrates the case of m=4 by way of example. m may of course be other 8, 16, 32, etc. In FIG. 5, reference numeral 20 indicates one example of the phase detector PDm (2) (where m=4) of the present invention, reference numeral 21 indicates an input terminal of a clock signal ckv_1, reference numeral 22 indicates an input terminal of a clock signal ckv_2, reference numeral 23 indicates an input terminal of a clock signal ckv_3, reference numeral 24 indicates an input terminal of a clock signal ckv_4, and reference numeral 25 indicates an input terminal of an input data signal Din, respectively. Reference numerals 31, 32, 33 and 34 indicate latches $L_1$, $L_2$, $L_3$ and $L_4$ having D terminals of data inputs, C terminals of clock inputs and Q outputs ($q_1$ and the like), respectively, reference numerals 41, 42, 43 and 44 indicate D type flip flops $FF_1$, $FF_2$, $FF_3$ and $FF_4$ having D terminals of data inputs, C terminals of clock inputs and Q outputs ($qf_1$ and the like), reference numerals 51 through 58 indicate exclusive-OR circuits $XOR_1$ through $XOR_8$, reference numerals 61 through 68 indicate AND circuits $AND_1$ through $AND_8$, reference numeral 71 indicates an output terminal of an error signal (error_1), reference numeral 72 indicates an output terminal of an error signal (error_2), reference numeral 73 indicates an output terminal of an error signal (error_3), reference numeral 74 indicates an output terminal of an error signal (error_4), reference numeral 75 indicates an output terminal of a reference signal (ref_1), reference numeral 76 indicates an output terminal of a reference signal (ref_2), reference numeral 77 indicates an output terminal of a reference signal (ref_3), and reference numeral 78 indicates an output terminal of a reference signal (ref_4), respectively.

The phase detector PDm (20) of the present invention is a phase comparator which compares the differences in phase between a transient edge of the input data signal Din and transient edges of the clock signals ckv_k (where k=1~m). The input data signal Din has a period or cycle of T, and the clock signals ckv_k (where k=1~m) are m clock signals whose frequencies are expressed in f/m (where f=1/T) and whose phases are different 2π/m by 2π/m. As shown in FIG. 5, the phase detector PDm (20) of the present invention includes a latch unit 30 which latches the input data signal Din in parallel on the rising edges of the respective clock signals ckv_k respectively, an error signal output unit 50 which outputs m error signals (error_1 and the like) respectively indicative of the differences in phase between the transient edge of the input data signal Din and the transient edges of the respective clock signals ckv_k and each having a minimum pulse width of (m/2−1)×T or more, based on respective output signals ($q_1$ and the like) produced from the latch unit 30 and the respective clock signals ckv_k, an input unit 40 which inputs the respective output signals ($q_1$ and the like) of the latch unit 30 in parallel on the rising edges of the respective clock signals ckv_k, and a reference signal output unit 60 which outputs m reference signals (ref_1 and the like) whose pulse widths are (m/2)×T, based on output signals ($qf_1$ and the like) produced from the input unit 40 and the respective clock signals ckv_k. Further, the phase detector PDm (20) is provided with an output unit (not shown) which outputs m data signals Dout_k (where k=1~m) obtained by effecting predetermined shape processing on the input data signal Din when a predetermined lock state is reached, and outputs one or more clock signals ckvout.

The latch unit 30 includes latches $L_i$ (where i=1~m) provided in parallel, which latch the input data signal Din on the rising edges of the clock signals ckv_k. As shown in FIG. 5, the latch $L_1$ (31) latches the input data signal Din inputted to a D terminal thereof on the rising edge of the clock signal ckv_1 inputted to a C terminal thereof, and outputs the input data signal Din to a Q output ($q_1$) thereof. While the clock signal ckv_1 inputted to the C terminal is High (logical 0), the latch $L_1$ (31) holds the Q output ($q_1$) as it is. On the other hand, while the clock signal ckv_1 inputted to the C terminal is Low (logical 0), the latch $L_1$ (31) outputs the input data signal Din to the Q output ($q_1$) as it is. Thus, when the input data signal Din changes in mid course while the clock signal ckv_1 inputted to the C terminal is Low (logical 0), the Q output ($q_1$) also changes according to its change.

The latch $L_2$ (32) latches the input data signal Din inputted to a D terminal thereof on the rising edge of the clock signal ckv_2 inputted to a C terminal thereof, and outputs the input data signal Din to a Q output ($q_2$) thereof. While the clock signal ckv_2 inputted to the C terminal is High (logical 1), the latch $L_2$ (32) holds the Q output ($q_2$) as it is. On the other hand, while the clock signal ckv_2 inputted to the C terminal is Low (logical 0), the latch $L_2$ (32) outputs the input data signal Din to the Q output ($q_2$) as it is. Thus, when the input data signal Din changes in mid course while the clock signal ckv_2 inputted to the C terminal is Low (logical 0), the Q output ($q_2$) also changes according to its change.

The latch $L_3$ (33) latches the input data signal Din inputted to a D terminal thereof on the rising edge of the clock signal ckv_3 inputted to a C terminal thereof, and outputs the input data signal Din to a Q output ($q_3$) thereof. While the clock signal ckv_3 inputted to the C terminal is High (logical 1), the latch $L_3$ (33) holds the Q output ($q_3$) as it is. On the other hand, while the clock signal ckv_3 inputted to the C terminal is Low (logical 0), the latch $L_3$ (33) outputs the input data signal Din to the Q output ($q_3$) as it is. Thus, when the input data signal Din changes in mid course while the clock signal ckv_3 inputted to the C terminal is Low (logical 0), the Q output ($q_3$) also changes according to its change.

The latch $L_4$ (34) latches the input data signal Din inputted to a D terminal thereof on the rising edge of the clock signal ckv_4 inputted to a C terminal thereof, and outputs the input data signal Din to a Q output ($q_4$) thereof. While the clock signal ckv_4 inputted to the C terminal is High (logical 1), the latch $L_4$ (34) holds the Q output ($q_4$) as it is. On the other hand, while the clock signal ckv_4 inputted to the C terminal is Low (logical 0), the latch $L_4$ (34) outputs the input data signal Din to the Q output ($q_4$) as it is. Thus, when the input data signal Din changes in mid course while the clock signal ckv_4 inputted to the C terminal is Low (logical 0), the Q output ($q_4$) also changes according to its change.

The error signal output unit 50 outputs the ANDs of both the outputs of the XORing of the output signals $q_i$ of the latches $L_i$ in the latch unit 30 and the output signals $q_{k+1}$ of the latches $L_{k+1}$ (output signal $q_1$ of the latch $L_1$ in the case of k+1=m+1), and the clock signals ckv_k as the error signal (error_k) (where k=1~m). As shown in FIG. 5, the Q output ($q_1$) of the latch $L_1$ (31) and the Q output ($q_2$) of the latch $L_2$ (32) are inputted to an exclusive-OR circuit $XOR_1$ (51). Further, an output $q_1$ xor $q_2$ thereof and the clock signal ckv_1 are inputted to an AND circuit $AND_1$ (61), and an output ($q_1$ xor $q_2$)*ckv_1 thereof is outputted from the output terminal 71 as the error signal (error_1). Here, the mark "*" means a logical product or ANDing.

The Q output ($q_2$) of the latch $L_2$ (32) and the Q output ($q_3$) of the latch $L_3$ (33) are inputted to an exclusive-OR circuit $XOR_2$ (52). Further, an output $q_2$ xor $q_3$ thereof and the clock signal ckv_2 are inputted to an AND circuit $AND_2$ (62), and an output ($q_2$ xor $q_3$)*ckv_2 thereof is outputted from the output terminal 72 as the error signal (error_2).

The Q output ($q_3$) of the latch $L_3$ (33) and the Q output ($q_4$) of the latch $L_4$ (34) are inputted to an exclusive-OR circuit $XOR_3$ (53). Further, an output $q_3$ xor $q_4$ thereof and the clock signal ckv_3 are inputted to an AND circuit $AND_3$ (63), and an output ($q_3$ xor $q_4$)*ckv_3 thereof is outputted from the output terminal 73 as the error signal (error_3).

The Q output ($q_4$) of the latch $L_4$ (34) and the Q output ($q_1$) of the latch $L_1$ (31) are inputted to an exclusive-OR circuit $XOR_4$ (54). Further, an output $q_4$ xor $q_1$ and the clock signal ckv_4 are inputted to an AND circuit $AND_3$ (64), and an output ($q_4$ xor $q_1$)*ckv_4 is outputted from the output terminal 74 as the error signal (error_4). Thus, when k+1=m+1 exceeds the maximum number 4 as in the case of k+1=m+1=5 where m=4, the output signal $q_{k+1}$ (=$q_5$) of the latch $L_{k+1}$ (=$L_5$) is restored and set as the output signal $q_1$.

The input unit 40 includes D type flip flops $FF_k$ (where k=1~m) provided in parallel, which input the output signals $q_i$ of the latches $L_i$ in the latch unit 30 on the rising edges of the clock signals ckv_k+1 (clock signal ckv_1 in the case of k+1=m+1). As shown in FIG. 5, the D type flip flop $FF_1$ (41) latches the output signal $q_1$ of the latch $L_1$ (31) inputted to a D terminal thereof on the rising edge of the clock signal ckv_2 inputted to a C terminal thereof and outputs the signal $q_1$ to a Q output ($qf_1$) thereof. The D type flip flop $FF_1$ (41) holds the Q output ($qf_1$) during a period up to the rising edge of the following clock signal ckv_2 as it is. Accordingly, even when the $q_1$ at the D terminal changes in mid course during this period, the Q output ($qf_1$) is not changed according to its change.

The D type flip flop $FF_2$ (42) latches the output signal $q_2$ of the latch $L_2$ (32) inputted to a D terminal thereof on the rising edge of the clock signal ckv_3 inputted to a C terminal thereof and outputs the signal $q_2$ to a Q output ($qf_2$) thereof. The D type flip flop $FF_2$ (42) holds the Q output ($qf_2$) as it is during a period up to the rising edge of the following clock signal ckv_3. Accordingly, even when the $q_2$ at the D terminal changes in mid course during this period, the Q output ($qf_2$) is not changed according to its change.

The D type flip flop $FF_3$ (43) latches the output signal $q_3$ of the latch $L_3$ (33) inputted to a D terminal thereof on the rising edge of the clock signal ckv_4 inputted to a C terminal thereof and outputs the signal $q_3$ to a Q output ($qf_3$) thereof. The D type flip flop $FF_3$ (43) holds the Q output ($qf_3$) as it is during a period up to the rising edge of the following clock signal ckv_4. Accordingly, even when the $q_3$ at the D terminal changes in mid course during this period, the Q output ($qf_3$) is not changed according to its change.

The D type flip flop $FF_4$ (44) latches the output signal $q_4$ of the latch $L_4$ (34) inputted to a D terminal thereof on the rising edge of the clock signal ckv_1 inputted to a C terminal thereof and outputs the signal $q_4$ to a Q output ($qf_4$) thereof. The D type flip flop $FF_4$ (44) holds the Q output ($qf_4$) as it is during a period up to the rising edge of the following clock signal ckv_1. Accordingly, even when the $q_4$ at the D terminal changes in mid course during this period, the Q output ($qf_4$) is not changed according to its change. Thus, when k+1=m+1 exceeds the maximum number 4 as in the case of k+1=m+1=5 where m=4, the clock signal ckv_k+1 (=ckv_5) of the D type flip flop $FF_{k+1}$ (=$FF_5$) is restored and set as the clock signal ckv_1.

The reference signal output unit 60 outputs the ANDs of both the outputs of XORing of the output signals $qf_k$ of the D type flip flops $FF_k$ of the input unit 40 and the output signals $qf_{k+1}$ of the D type flip flops $FF_{k+1}$ (the output signal $qf_1$ of the D type flip flop $FF_1$ in the case of k+1=m+1) and the clock signals ckv_k+2 (clock signal ckv_1 in the case of k+2=m+1 or clock signal ckv_2 in the case of k+2=m+2) as the reference signals ref_k (where k=1~m). As shown in FIG. 5, the Q output ($qf_1$) of the D type flip flop $FF_1$ (41) and the Q output ($qf_2$) of the D type flip flop $FF_2$ (42) are inputted to an exclusive-OR circuit $XOR_5$ (55). Further, an output $qf_1$ xor $qf_2$ thereof and the clock signal ckv_3 are inputted to an AND circuit $AND_5$ (65), and an output ($qf_1$ xor $qf_2$)*ckv_3 thereof is outputted from the output terminal 75 as the reference signal (ref_1).

The Q output ($qf_2$) of the D type flip flop $FF_2$ (42) and the Q output ($qf_3$) of the D type flip flop $FF_3$ (43) are inputted to an exclusive-OR circuit $XOR_6$ (56). Further, an output $qf_2$ xor $qf_3$ thereof and the clock signal ckv_4 are inputted to an AND circuit $AND_6$ (66), and an output ($qf_2$ xor $qf_3$)*ckv_4 thereof is outputted from the output terminal 76 as the reference signal (ref_2).

The Q output ($qf_3$) of the D type flip flop $FF_3$ (43) and the Q output ($qf_4$) of the D type flip flop $FF_4$ (44) are inputted to an exclusive-OR circuit $XOR_7$ (57). Further, an output $qf_3$ xor $qf_4$ thereof and the clock signal ckv_1 are inputted to an AND circuit $AND_7$ (67), and an output ($qf_3$ xor $qf_4$)*ckv_1 thereof is outputted from the output terminal 77 as the reference signal (ref_3). Thus, when k+1=m+1 exceeds maximum number 4 as in the case of k+1=m+1=5 where m=4, the clock signal ckv_k+1(=ckv_5) inputted to the AND circuit $AND_7$ (67) is restored and set as the clock signal ckv_1.

The Q output ($qf_4$) of the D type flip flop $FF_4$ (44) and the Q output ($qf_1$) of the D type flip flop $FF_1$ (41) are inputted to an exclusive-OR circuit $XOR_8$ (58). Further, an output $qf_4$ xor $qf_1$ thereof and the clock signal ckv_2 are inputted to an AND circuit $AND_8$ (68), and an output ($qf_4$ xor $qf_1$)*ckv_2 thereof is outputted from the output terminal 78 as the reference signal (ref_4). Thus, when k+1=m+1 exceeds the maximum number 4 as in the case of k+1=m+1 =5 where m=4, the output signal $qf_{k+1}$ ($qf_5$) of the D type flip flop $FF_k$+1 (=$FF_5$) is restored and set as the output signal $qf_1$. Further, the clock signal ckv_k+2 (=ckv_6) inputted to the AND circuit $AND_8$ (68) is advanced one from the output signal ckv_1 so as to take ckv_2.

Figure 6:
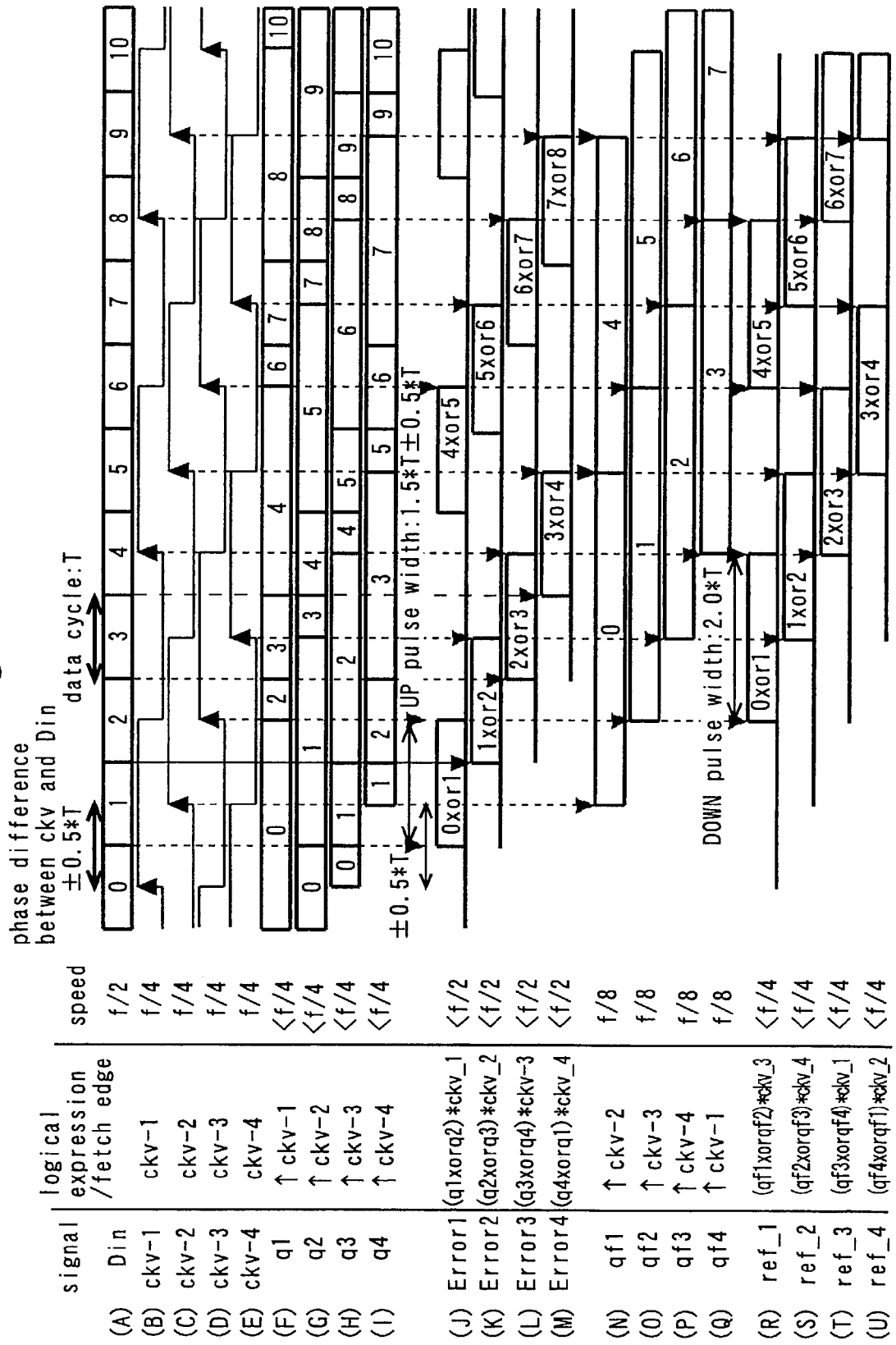
FIG. 6 shows a time chart of the phase detector PDm of the present invention, which is shown in FIG. 5.

FIGS. 6(A) through 6(U) show a time chart of the phase detector PDm (2) of the present invention, which is shown in FIG. 5. Since spots or parts marked with the same reference numerals as 30 those shown in FIG. 5 indicate the same parts in FIGS. 6(A) through 6(U), their description will be omitted. A signal shown in FIG. 6(A) shows that the name thereof indicates the input data signal Din and the speed thereof (expressed in Hz conversion and will be similar subsequently) is expressed in f/2 (data period or cycle is given by T (=1/f)). The signal is expressed in the form of data 0, data 1, etc. for each cycle T. A signal shown in FIG. 6(B) indicates that the name thereof is represented as the clock signal ckv_1, its logical expression is given as ckv_1, the speed thereof is expressed in f/4, the input data signal Din rises during the data 0, and the input data signal Din falls during the data 2. A signal shown in FIG. 6(C) indicates that the name thereof is represented as the clock signal ckv_2, its logical expression is given as ckv_2, the speed thereof is expressed in f/4, the input data signal Din rises during the data 1, and the input data signal Din falls during the data 3. A signal shown in FIG. 6(D) indicates that the name thereof is represented as the clock signal ckv_3, its logical expression is given as ckv_3, the speed thereof is expressed in f/4, the input data signal Din rises during the data 2, and the input data signal Din falls during the data 4. A signal shown in FIG. 6(E) indicates that the name thereof is represented as the clock signal ckv_4, its logical expression is given as ckv_4, the speed thereof is expressed in f/4, the input data signal Din rises during the data 3, and the input data signal Din falls during the data 5.

A signal shown in FIG. 6(F) indicates that the name thereof is represented as the output $q_1$ of the latch $L_1$ (31), a fetch edge at the D terminal of the latch $L_1$ (31) is indicative of the rising edge (↑ckv_1) of the clock signal ckv_1, and the speed of each of signals (0, 4, 8, . . . ) to be used is expressed in less than f/4. A signal shown in FIG. 6(G) indicates that the name thereof is represented as the output $q_2$ of the latch $L_2$ (32), a fetch edge at the D terminal of the latch $L_2$ (32) is indicative of the rising edge (↑ckv_2) of the clock signal ckv_2, and the speed of each of signals (1, 5, 9, . . . ) to be used is expressed in less than f/4. A signal shown in FIG. 6(H) indicates that the name thereof is represented as the output $q_3$ of the latch $L_3$ (33), a fetch edge at the D terminal of the latch $L_3$ (33) is indicative of the rising edge (↑ckv_3) of the clock signal ckv_3, and the speed of each of signals (2, 6, . . . ) to be used is expressed in less than f/4. A signal shown in FIG. 6(I) indicates that the name thereof is represented as the output $q_4$ of the latch $L_4$ (34), a fetch edge at the D terminal of the latch $L_4$ (34) is indicative of the rising edge (↑ckv_4) of the clock signal ckv_4, and the speed of each of signals (3, 7, . . . ) to be used is expressed in less than f/4.

A signal shown in FIG. 6(J) indicates that the name thereof is represented as the error signal ($Error_1$) of the AND circuit 61, a logical expression indicative of the output of the AND circuit 61 is expressed in $(q_1 \text{ xor } q_2)*ckv\_1$, and the speed thereof is slower than f/2. A signal shown in FIG. 6(K) indicates that the name thereof is represented as the error signal ($Error_2$) of the AND circuit 62, a logical expression indicative of the output of the AND circuit 62 is given as $(q_2 \text{ xor } q_3)*ckv\_2$, and the speed thereof is slower than f/2. A signal shown in FIG. 6(L) indicates that the name thereof is represented as the error signal ($Error_3$) of the AND circuit 63, a logical expression indicative of the output of the AND circuit 63 is given as $(q_3 \text{ xor } q_4)*ckv\_3$, and the speed thereof is slower than f/2. A signal shown in FIG. 6(M) indicates that the name thereof is represented as the error signal ($Error_4$) of the AND circuit 64, a logical expression indicative of the output of the AND circuit 64 is given as $(q_4 \text{ xor } q_1)*ckv\_4$, and the speed thereof is slower than f/2. Inputting the m clock signals ckv_i whose frequencies are f/m(Hz) and whose phases are different 2π/m by 2π/m, to the m latches $L_1$ as described above makes it possible to reduce the speeds of the error signals ($Error_1$) to 2f/m(Hz) slower than f(Hz).

A signal shown in FIG. 6(N) indicates that the name thereof is represented as the output $qf_1$ of the D type flip flop $FF_1$ (41), a fetch edge at the D terminal of the D type flip flop $FF_1$ (41) is indicative of the rising edge (↑ckv_2) of the clock signal ckv_2, and the speed thereof is expressed in f/8. A signal shown in FIG. 6(O) indicates that the name thereof is represented as the output $qf_2$ of the D type flip flop $FF_2$ (42), a fetch edge at the D terminal of the D type flip flop $FF_2$ (42) is indicative of the rising edge (↑ckv_3) of the clock signal ckv_3, and the speed thereof is expressed in f/8. A signal shown in FIG. 6(P) indicates that the name thereof is represented as the output $qf_3$ of the D type flip flop $FF_3$ (43), a fetch edge at the D terminal of the D type flip flop $FF_3$ (43) is indicative of the rising edge (↑ckv_4) of the clock signal ckv_4, and the speed thereof is expressed in f/8. A signal shown in FIG. 6(Q) indicates that the name thereof is represented as the output $qf_4$ of the D type flip flop $FF_4$ (44), a fetch edge at the D terminal of the D type flip flop $FF_4$ (44) is indicative of the rising edge (↑ckv_1) of the clock signal ckv_1, and the speed thereof is expressed in f/8.

A signal shown in FIG. 6(R) indicates that the name thereof is represented as the reference signal (ref_1) of the AND circuit 65, a logical expression indicative of the output of the AND circuit 65 is given as $(qf_1 \text{ xor } qf_2)*ckv\_3$, and the speed thereof is slower than f/4. A signal shown in FIG. 6(S) indicates that the name thereof is represented as the reference signal (ref_2) of the AND circuit 66, a logical expression indicative of the output of the AND circuit 66 is given as $(qf_2 \text{ xor } qf_3)*ckv\_4$, and the speed thereof is slower than f/4. A signal shown in FIG. 6(T) indicates that the name thereof is represented as the reference signal (ref_3) of the AND circuit 67, a logical expression indicative of the output of the AND circuit 67 is given as $(qf_3 \text{ xor } qf_4)*ckv\_1$, and the speed thereof is slower than f/4. A signal shown in FIG. 6(U) indicates that the name thereof is represented as the reference signal (ref_4) of the AND circuit 68, a logical expression indicative of the output of the AND circuit 68 is given as $(qf_4 \text{ xor } qf_1)*ckv\_2$, and the speed thereof is slower than f/4. Inputting the m clock signals ckv_i whose frequencies are f/m(Hz) and whose phases are different 2π/m by 2π/m, to the m D type flip flops $FF_i$ as described above makes it possible to reduce the speeds of the reference signals (ref_i) to f/m(Hz) slower than f/2(Hz).

As shown in FIGS. 6(A), 6(B) and 6(F), the latch $L_1$ (31) takes in or captures the input data signal Din (data 0) on the rising edge of the clock signal ckv_1 and outputs it to the $q_1$ output thereof. Since the clock signal ckv_1 is High even if the input data signal transitions from the data 0 to the data 1, the $q_1$ output holds the data 0. While the clock signal ckv_1 is held Low, the data 2 of the input data signal Din appears at the output $q_1$ as it is. When the input data signal Din transitions to the data 3 and 4, they appear at the output $q_1$ as they are. Next, when the clock signal ckv_1 rises while the input data signal Din is of the data 4, the latch $L_1$ (31) takes in the data 4 and outputs it to the $q_1$ output. Since the clock signal ckv_1 is High even if the input data signal transitions from the data 4 to the data 5 and 6, the $q_1$ output holds the data 4. Since such a process is similar subsequently, the description thereof will be omitted.

As shown in FIGS. 6(A), 6(C) and 6(G), the latch $L_2$ (32) sequentially outputs the input data signal Din (data 0 and 1) to the $q_2$ output when the clock signal ckv_2 is held Low. On the rising edge of the clock signal ckv_2, the latch $L_2$ (32) captures the input data signal Din (data 1) and outputs it to the $q_2$ output. Since the clock signal ckv_2 is High even if the input data signal transitions from the data 1 to the data 2 and 3, the $q_2$ output holds the data 1. While the clock signal ckv_2 is Low, the data 3, 4 and 5 of the input data signal Din appear at the output $q_2$ as they are. Next, when the clock signal ckv_2 rises while the input data signal Din is of the data 5, the latch $L_2$ (32) captures the data 5 and outputs it to the $q_2$ output. Since it is similar subsequently, the description thereof will be omitted.

As shown in FIGS. 6(A), 6(D) and 6(H), the latch $L_3$ (33) sequentially outputs the input data signal Din (data 0, 1 and 2) to the $q_3$ output when the clock signal ckv_3 is held Low. On the rising edge of the clock signal ckv_3, the latch $L_3$ (33) captures the input data signal Din (data 2) and outputs it to the $q_3$ output. Since the clock signal ckv_3 is High even if the input data signal transitions from the data 2 to the data 3 and 4, the $q_3$ output holds the data 2. While the clock signal ckv_3 is Low, the data 4, 5 and 6 of the input data signal Din appear at the output $q_3$ as they are. Next, when the clock signal ckv_3 rises while the input data signal Din is of the data 6, the latch $L_3$ (33) takes in the data 6 and outputs it to the $q_3$ output. Since it is similar subsequently, the description thereof will be omitted.

As shown in FIGS. 6(A), 6(E) and 6(I), the latch $L_4$ (34) sequentially outputs the input data signal Din (data 1, 2 and 3) to the $q_4$ output when the clock signal ckv_4 is held Low. On the rising edge of the clock signal ckv_4, the latch $L_4$ (34) captures the input data signal Din (data 3) and outputs it to the $q_4$ output. Since the clock signal ckv_4 is High even if the input data signal transitions from the data 3 to the data 4 and 5, the $q_4$ output holds the data 3. While the clock signal ckv_4 is Low, the data 5, 6 and 7 of the input data signal Din appear at the output $q_4$ as they are. Next, when the clock signal ckv_4 rises while the input data signal Din is of the data 7, the latch $L_4$ (34) takes in the data 7 and outputs it to the $q_4$ output. Since this is similar subsequently, the description thereof will be omitted.

As shown in FIGS. 6(B), 6(F), 6(G) and 6(J), the output of the error signal (Error$_1$) results in "0xor1" when, for example, the clock signal ckv_1 is High (logical 1) and the output $q_1$ is of the data 0 and the output $q_2$ is of the data 1. When the clock signal ckv_1 is not High (logical 1), the output of the error signal (Error$_1$) results in 0 even where the output $q_1$ and the output $q_2$ are data different from each other. Therefore, there is no need to output each pulse having no bearing on a phase comparison as the error signal (Error$_1$) as in the case where the output $q_1$ is of the data 2 and the output $q_2$ is of the data 1 or the output $q_1$ is of the data 3 and the output $q_2$ is of the data 1. Consequently, it is possible to prevent deterioration in phase comparison accuracy or the occurrence of a malfunction. Namely, the ANDing of both the output of XORing of the outputs $q_1$ and $q_2$ (by the XOR circuit 51) and the clock signal ckv_1 (by the AND circuit 61) makes it possible to output only each of pulses "0xor1" "4xor5", etc. related to phase comparisons as the error signal (Error$_1$).

As shown in FIG. 6(J), the pulse width of the error signal (Error$_1$) becomes a pulse having a length of (m/2−0.5)×T when the rising edge of the clock signal ckv_1 is centrally located with respect to the cycle T of the input data signal Din. When the rising edge of the clock signal ckv_1 is placed forward by Δt from the center of the input data signal Din, the error signal (Error1) reduced by Δt in pulse width is outputted. On the other hand, when the rising edge of the clock signal ckv_1 is placed backward by Δt from the center of the input data signal Din, the error signal (Error$_1$) whose pulse width is increased by Δt, is outputted. When m=4 and Δt=0.5×T, the pulse width of the error signal (Error$_1$) results in 1.5×T±0.5×T with respect to ±0.5×T as shown in FIG. 6(J). Other error signals (Error$_1$) to be described later are also similar to the above.

As shown in FIGS. 6(C), 6(G), 6(H) and 6(K) the output of the error signal (Error$_2$) becomes "1xor2" when, for example, the clock signal ckv_2 is High (logical 1), and the output $q_2$ is of the data 1 and the output $q_3$ is of the data 2. When the clock signal ckv_2 is not High (logical 1), the output of the error signal (Error$_2$) results in 0 even when the output $q_2$ and the output $q_3$ are data different from each other. Namely, the ANDing of both the output of XORing of the outputs $q_2$ and $q_3$ (by the XOR circuit 52) and the clock signal ckv_2 (by the AND circuit 62) in a manner similar to the above makes it possible to output only each of pulses "1xor2 " "5xor6", etc. related to phase comparisons as the error signal (Error$_2$).

As shown in FIGS. 6(D), 6(H), 6(I) and 6(L), the output of the error signal (Error$_3$) becomes "2xor3" when, for example, the clock signal ckv_3 is High (logical 1), and the output $q_3$ is of the data 2 and the output $q_4$ is of the data 3. When the clock signal ckv_3 is not High (logical 1), the output of the error signal (Error$_3$) results in 0 even when the output $q_3$ and the output $q_4$ are data different from each other. Namely, the ANDing of both the output of XORing of the outputs $q_3$ and $q_4$ (by the XOR circuit 53) and the clock signal ckv_3 (by the AND circuit 63) in a manner similar to the above makes it possible to output only each of pulses "2xor3" "6xor7", etc. related to phase comparisons as the error signal (Error$_3$).

As shown in FIGS. 6(E), 6(F), 6(I) and 6(M), the output of the error signal (Error$_4$) becomes "3xor4" when, for example, the clock signal ckv_4 is High (logical 1), and the output $q_4$ is of the data 3 and the output $q_1$ is of the data 4. When the clock signal ckv_4 is not High (logical 1), the output of the error signal (Error$_4$) results in 0 even when the output $q_4$ and the output $q_1$ are data different from each other. Namely, the ANDing of both the output of XORing of the outputs $q_4$ and $q_1$ (by the XOR circuit 54) and the clock signal ckv_4 (by the AND circuit 64) in a manner similar to the above makes it possible to output only each of pulses "3xor4" "7xor8", etc. related to phase comparisons as the error signal (Error$_4$).

As shown in FIGS. 6(N), 6(O) and 6(R), the output of the reference signal (ref_1) results in "0xor1" when, for example, the clock signal ckv_3 is High (logical 1) and the output $qf_1$ is of the data 0 and the output $qf_2$ is of the data 1. When the clock ckv_3 is not High (logical 1), the output of the reference signal (ref_1) reaches 0 even when the output $qf_1$ and the output $qf_2$ are data different from each other. The latches are used in the conventional phase detector, whereas the D type flip flops are in the phase comparator according to the present invention. It is therefore possible to eliminate the pulses having no bearing on the phase comparisons. Further, the ANDing of both the output of XORing of the outputs $qf_1$ and $qf_2$ (by the XOR circuit 55) and the clock signal ckv_3 (by the AND circuit 65) makes it possible to eliminate such pulses unnecessary for the phase comparisons as to cause deterioration in phase comparison accuracy or the occurrence of a malfunction as in the case where the output qf_is of the data 4 and the output $qf_2$ is of the data 1. As a result, only each of the pulses "0xor4" "4xor5", etc. related to the phase comparisons can be outputted as the reference signal (ref_1). As shown in FIG. 6(R), when transition in the input data signal Din takes place, the reference signal (ref_1) is outputted as a pulse having a longitudinal width (=2.0×T, generally, (m/2)×T always equal to twice the data cycle T in the case of m=4. Other reference signals to be described later are also similar.

As shown in FIGS. 6(O), 6(P) and 6(S), the output of the reference signal (ref_2) results in "1xor2" when, for example, the clock signal ckv_4 is High (logical 1) and the output $qf_2$ is of the data 1 and the output $qf_3$ is of the data 2. When the clock ckv_4 is not High (logical 1), the output of the reference signal (ref_2) reaches 0 even when the output $qf_2$ and the output $qf_3$ are data different from each other. Namely, as described above, such pulses unnecessary for phase comparisons as to cause deterioration in phase comparison accuracy or the occurrence of a malfunction can be eliminated. Only each of the pulses "1xor2" "5xor6", etc. related to the phase comparisons can be outputted as the reference signal (ref_2).

As shown in FIGS. 6(P), 6(Q) and 6(T), the output of the reference signal (ref_3) results in "2xor3" when, for example, the clock signal ckv_1 is High (logical 1) and the output $qf_3$ is of the data 2 and the output $qf_4$ is of the data 3. When the clock ckv_1 is not High (logical 1), the output of the reference signal (ref_3) reaches 0 even when the output $qf_3$ and the output $qf_4$ are data different from each other. Namely, as described above, such pulses unnecessary for phase comparisons as to cause deterioration in phase comparison accuracy or the occurrence of a malfunction can be eliminated. Only each of the pulses "2xor3" "6xor7", etc. related to the phase comparisons can be outputted as the reference signal (ref_3).

As shown in FIGS. 6(Q), 6(N) and 6(U), the output of the reference signal (ref_4) results in "3xor4" when, for example, the clock signal ckv_2 is High (logical 1) and the output $qf_4$ is of the data 3 and the output $qf_1$ is of the data 4. When the clock ckv_2 is not High (logical 1), the output of the reference signal (ref_4) reaches 0 even when the output $qf_4$ and the output $qf_1$ are data different from each other. Namely, as mentioned above, such pulses unnecessary for phase comparisons as to cause deterioration in phase comparison accuracy or the occurrence of a malfunction can be eliminated. Only each of the pulses "3xor4" "7xor8", etc. related to the phase comparisons can be outputted as the reference signal (ref_4).

According to the phase detector PDm (2) of the present invention as described above, the m clock signals ckv_k whose frequencies are f/m (Hz) and whose phases are different $2\pi/m$ by $2\pi/m$ are inputted to the m latches $L_k$, whereby the speed of each of the error signals (error_k) (where k=1~m) can be reduced to 2f/m (Hz). The speed of each of the phase comparison reference signals ref_k (where k=1~m) can be also reduced to f/m (Hz) in the same manner. Namely, the phase comparisons between the input data signal Din and the clock signals ckv_k (where k=1~m) whose speeds are set to f/m (Hz), by the phase detector PDm (2) of the present invention can be performed using the error signals (error_k) (where k=1~m) extremely slower than ever, which speeds are 2f/m (Hz) even at the maximum, and the phase comparison reference signals ref_k (where k=1~m) having f/m(Hz).

Further, according to the phase detector PDm (2) of the present invention, both the output of XORing of the outputs $q_k$ and $q_{k+1}$ and the clock signals ckv_k (where k=1~m) are ANDed to thereby allow only the pulses related to the phase comparisons to be outputted as the error signals (error_k) (where k=1~m). Namely, there is no need to output the pulses having no bearing on the phase comparisons as the error signals (error_k) (where k=1~m). Thus, it is possible to avoid deterioration in phase comparison accuracy or the occurrence of a malfunction. Even in the phase comparison reference signals ref_k (where k=1~m), the output of XORing of the outputs $qf_k$ and $qf_{k+1}$ thereof and the clock signal ckv_k+2 are ANDed to thereby make it possible to eliminate such pulses unnecessary for phase comparisons as to cause deterioration in phase comparison accuracy and the occurrence of a malfunction. As a result, only the pulses related to the phase comparisons can be outputted as the phase comparison reference signals ref_k (where k=1~m).

Figure 7:
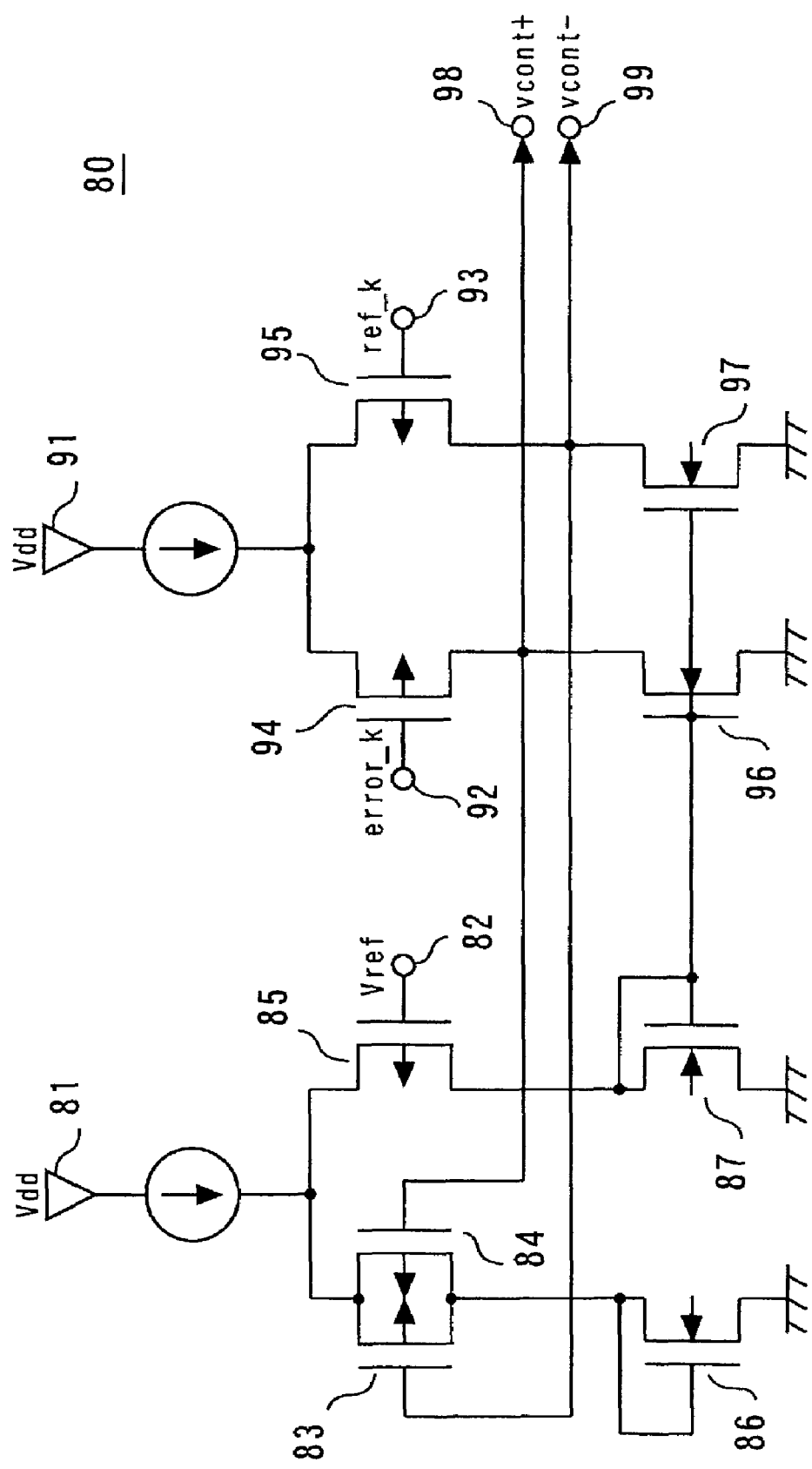
FIG. 7 is a block diagram showing the charging pump.

As an example of the charging pump CP_k in the CDR circuit 10 of the present invention, a charging pump can be used which is shown in, for example, "A 10-Gb/s CMOS Clock and Data Recovery Circuit with a Half-Rate Linear Phase Detector", J. Savoj, et al., IEEE Journal of Solid-State circuits, Vol. 36, No. 5, May 2001, p. 765, FIG. 10. FIG. 7 is a block diagram showing the charging pump referred to above. In FIG. 7, reference numeral 80 indicates an example of the charging pump CP_k in the CDR circuit 10 of the present invention, reference numeral 81 indicates a source voltage Vdd terminal, reference numeral 82 indicates a reference voltage Vref terminal, and reference numerals 83 through 87 indicate transistors, respectively. Similarly, reference numeral 91 indicates a source voltage Vdd terminal, reference numeral 92 indicates an input terminal of the error signals (error_k), reference numeral 93 indicates an input terminal of the phase comparison reference signal (Ref)_k, and reference numerals 94 through 97 indicate transistors, respectively. Reference numerals 98 and 99 indicate output terminals of the charging pump CP_k, which respectively indicate potentials vcont+ and vcont−. The output terminals 98 and 99 are connected to a loop filter 6. Since the operation of the whole circuit is described above, the description thereof will be omitted.

Figure 8:
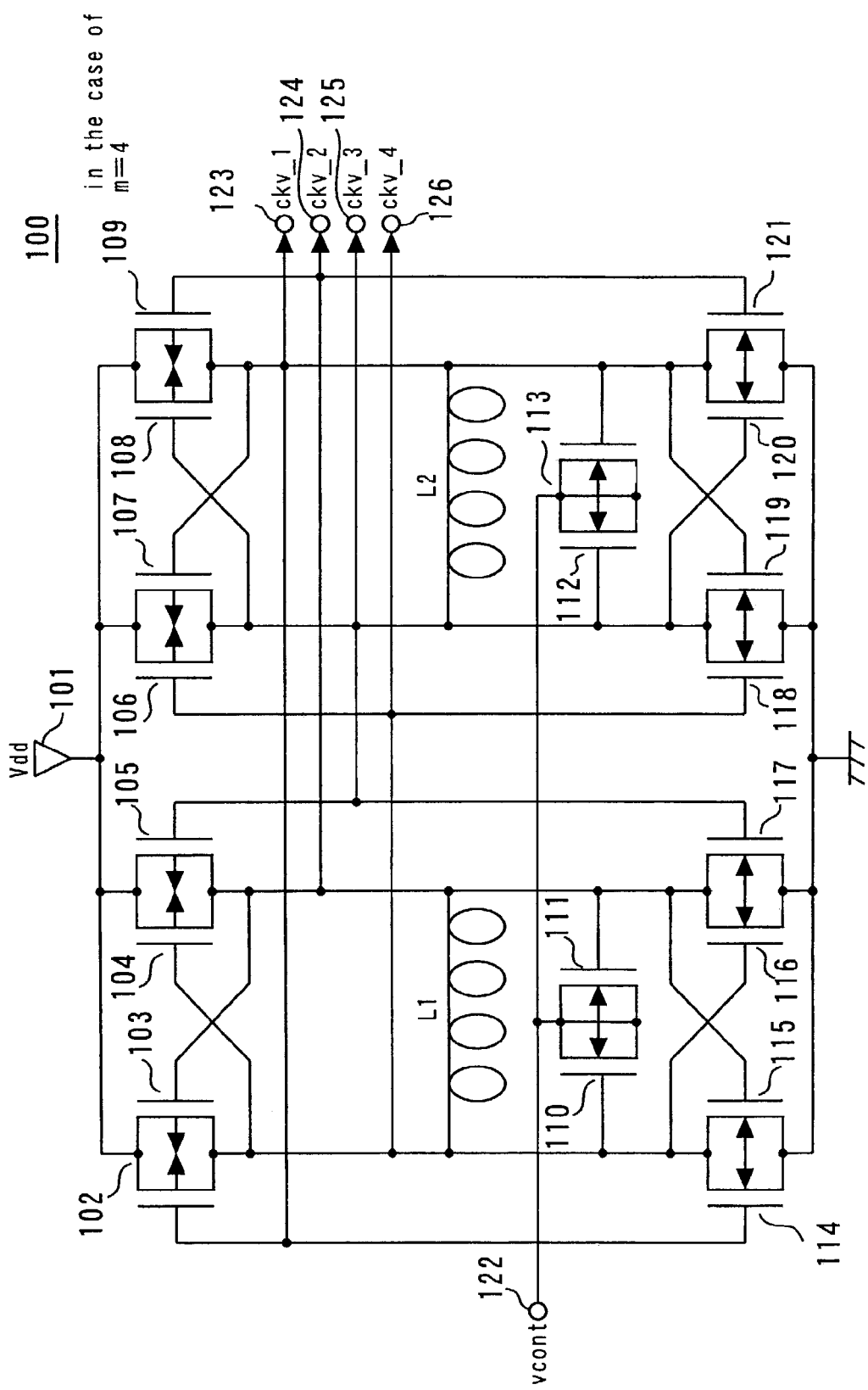
FIG. 8 is a block diagram showing the voltage controlled oscillator.

As an example of the voltage controlled oscillator VCOm (12) in the CDR circuit 10 of the present invention, a voltage controlled oscillator can be utilized which is shown in, for example, "Low-Power Low-Phase-Noise Differentially Tuned Quadrature VCO Design in Standard CMOS", M. Tiebout, IEEE Journal of Solid-State circuits, Vol. 36, No. 7, July 2001, p.1023, FIG. 11. FIG. 8 is a block diagram showing the voltage controlled oscillator referred to above. In FIG. 8, reference numeral 100 indicates an example of the voltage controlled oscillator VCOm (12) employed in the CDR circuit 10 of the present invention (where m=4), reference numeral 101 indicates a source voltage Vdd terminal, reference numerals 102 through 121 indicate transistors, reference numeral 122 indicates an input terminal of a voltage vcont outputted from the double/single-phase voltage converter DSC (11), and reference numerals 123 through 126 indicate output terminals of the respective clock signals ckv_1 through ckv_3. Since the operation of the whole circuit is described above, the description thereof will be omitted.

In the illustrated embodiment, a low-pass filter (not shown) is provided in series between the loop filter 6 and the double/single-phase voltage converter DSC (11) where noise is generated in the difference in potential between vcont+ and vcont− due to charging pump currents different in phase, which are produced from the plurality of charging pumps CP_k (where k=1~m). Consequently, noise can be reduced to such a degree as not to influence the circuit operation of the CDR circuit 10.

While the above embodiment has shown, as an example, where one signal is used for the respective signals, the use of differential signals for the respective signals and improvements in circuit's operating speed and noise margin can be easily inferable from analogy. It is also easily inferable from analogy that when the differential signals are used, an inverted signal of the clock signal ckv_1 is used for the clock signal ckv_3, an inverted signal of the clock signal ckv_2 is used for the clock signal ckv_4, and circuits for latching an input signal in the latches $L_3$ (33) and $L_4$ (34) and the D type flip flops $FF_2$ (42) and $FF_3$ (43) on the falling edges of clock signals are used.

The aforementioned phase comparator 20 can be applied to a transceiver. In this case, a phase comparing operation can be realized at 5 G (Hz) or less with respect to, for example, input data having a speed of 10 Gb/s. Therefore, timing design and packaging design, and the like become easy, and even upon realization of a phase comparator per se, the degree of freedom of its design and manufacture can be increased.

The features and advantages of the present invention may be summarized as follows.

According to the phase comparator of the present invention as described above, the m clock signals $ckv_1$ whose frequencies are expressed in f/m (Hz) and whose phases are different $2\pi/m$ by $2\pi/m$ are inputted to the m latches $L_1$ to thereby allow the speeds of the error signals ($Error_1$) to be reduced to 2f/m (Hz) slower than f (Hz). The speeds of the reference signals ($Ref_1$) can be also reduced to f/m (Hz) slower than f/2 (Hz). Namely, there can be provided a phase comparator or the like capable of flexibly changing its operating speed according to speed characteristics of each used device without the need for each device operable at a speed equal to twice the speed of the input data signal Din.

According to the CDR circuit of the present invention, the m clock signals ckv_k (where k=1~m) whose frequencies are f/m (Hz) and whose phases are different $2\pi/m$ by $2\pi/m$, are used to thereby enable execution of the operation of feeding back the differences in phase between the data input signal Din and the clock signals ckv_k (where k=1~m) to the oscillation frequencies of the voltage controlled oscillator VCOm (12) and thereby causing the clock signals ckv_k (where k=1~m) to coincide in phase with the input data signal Din. In the operation of the CDR circuit of the present invention, the speeds of the error signals (error_k) (where k=1~m) and the speeds of the phase comparison reference signals ref_k (where k=1~m), which rate-control the operating speeds of the phase detector PDm (2) and the charging pumps CP_k (where k=1~m), can be reduced to about 1/m. Therefore, a CDR circuit capable of fastest operation can be provided without setting the error signals (error_k) (where k=1~m) and the phase comparison reference signals ref_k (where k=1~m) as high-speed pulses.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2002-158045, filed on May 30, 2002 and a Japanese Patent Application No. 2002-243347, filed on Aug. 23, 2002 including specifications, claims, drawings and summaries, on which the Convention priority of the present application is based, are incorporated herein by reference in its entirety.

What is claimed is:

1. A phase comparator for comparing differences in phase between a transient edge of an input data signal and transient edges of clock signals, comprising:

a latch unit for latching the input data signal in parallel on rising/falling edges of the respective clock signals respectively;

an error signal output unit for outputting m error signals respectively indicative of differences in phase between the transient edge of the input data signal and the transient edges of the respective clock signals and each having a minimum pulse width of (m/2−1)×T or more, based on respective output signals produced from the latch unit and the respective clock signals;

an input unit for inputting the respective output signals produced from the latch unit in parallel on the rising/falling edges of the respective clock signals; and a reference signal output unit for outputting m reference signals whose pulse widths are (m/2)×T, based on output signals produced from the input unit and the respective clock signals, wherein the input data signal having a cycle of T, and the clock signals are m clock signals whose frequencies are expressed in f/m (where f=1/T, and m=$2^n$ (where n: whole number greater than or equal to 2)) and whose phases are different $2\pi/m$ by $2\pi/m$.

2. The phase comparator according to claim 1, wherein the latch unit includes latches $L_i$ (where i=1~m) provided in parallel, which latch the input data signal on the rising/falling edges of clock signals ckv_1, the error signal output unit outputs the ANDs of both the outputs of XORing of the output signals $q_i$ of the latches $L_i$ and the output signals $q_{i+1}$ of the latches $L_{i+1}$ (an output signal $q_i$ of the latch $L_i$ in the case of i+1=m+1) in the latch unit, and the clock signals $ckv_i$ as error signal (Error)$_i$ (where i=~m), the input unit includes D type flip flops $FF_i$ (where i=1~m) provided in parallel, which input the output signals $q_i$ of the latches $L_i$ in the latch unit on the rising/falling edges of the clock signals $ckv_{i+1}$ (a clock signal $ckv_i$ in the case of i+1=m+1), and the reference signal output unit outputs the ANDs of both the outputs of XORing of output signals $qf_i$ of the D type flip flops $FF_{i+1}$ (an output signal $qf_i$ of the D type flip flop $FF_i$ in the case of i+1=m+1) and clock signals $ckv_{i+2}$ (a clock signal $ckv_i$ in the case of i+2=m+2 as reference signals $Ref_i$ (where i=1~m).

3. A clock data recovery circuit for allowing differences in phase between an input data signal and clock signals to coincide with one another, comprising:

a phase comparator for inputting the input data signal and the m clock signals and thereby outputting m error signals respectively indicative of differences in phase between a transient edge of the input data signal and transient edges of the respective clock signals and each having a minimum pulse width of (m/2−1)×T or more, and outputting m reference signals each having a pulse width of (m/2)×T;

a charging pump group having m charging pumps each of which inputs a predetermined one error signal of the m error signals outputted from the phase comparator and a predetermined one reference signal of the m reference signals and thereby outputs a charge current or a discharge current therefrom;

a loop filter commonly connected to the m respective charging pumps of the charging pump group and for the charging pump group on a time basis to thereby output a dc voltage component;

a voltage converter for converting the dc voltage component outputted from the loop filter to a predetermined voltage; and a voltage controlled oscillator for inputting the predetermined voltage outputted from the voltage converter and generating the m clock signals, wherein the voltage controlled oscillator outputs the generated m clock signals to the phase comparator, the phase comparator outputs m data signals obtained by subjecting predetermined shape processing to the input data signal and one or more clock signals when the phase comparator is brought to a predetermined lock state, the input data signal has a cycle of T, and the clock signals are m clock signals whose frequencies are expressed in f/m (where f=1/T, and m=$2^n$ (where n:

whole number greater than or equal to 2)) and whose phases are different $2\pi/m$ by $2\pi/m$.

4. The clock data recovery circuit according to claim 3, wherein the phase comparator includes:

a latch unit for latching the input data signal in parallel on rising/falling edges of the respective clock signals respectively;

an error signal output unit for outputting m error signals respectively indicative of differences in phase between the transient edge of the input data signal and the transient edges of the respective clock signals and m error signals having a minimum pulse width of $(m/2=1) \times T$ or more, based on respective output signals produced from the latch unit and the respective clock signals;

an input unit for inputting the respective output signals produced from the latch unit in parallel on the rising/falling edges of the respective clock signals; and a reference signal output unit for outputting m reference signals whose pulse widths are $(m/2) \times T$, based on output signals produced from the input unit and the respective clock signals.

5. The clock data recovery circuit according to claim 4, wherein the latch unit includes latches $L_i$ (where i=i~m) provided in parallel, which latch the input data signal on the rising/falling edges of clock signals ckv_i, the error signal output unit outputs the ANDs of both the outputs of XORing of the output signals $q_i$ of the latches $L_i$ and the output signals $q_{i+1}$ of the latches $L_i+1$ (an output signal $q_i$ of the latch $L_i$ in the case of i+1=m+1) in the latch unit, and the clock signals ckv$_i$ as error signal (Error)$_i$ (where i=i~m), the input unit includes D type flip flops $FF_i$ (where i=i~m) provided in parallel, which input the output signals $q_i$ of the latches $L_i$ in the latch unit on the rising/falling edges of the clock signals ckv$_{i+1}$ (a clock signal ckv$_i$ in the case of i+1=m+1), and the references signal output unit outputs the ANDs of both the outputs of XORing of output signals qf$_i$ of the D type flip flops $FF_i$ of the input unit and output signals qf$_{i+1}$ of the D type flip flops $FF_{i+1}$ (an output signal qf$_i$ of the D type flip flop $FF_i$ in the case of i+1=m+1) and clock signals ckv$_{i+2}$ (a clock signal ckv$_i$ in the case of i+2=m+1 or a clock signal ckv$_2$ in the case of i+2=m+2) as reference signals Ref$_i$ (where i=1~m).

6. The clock data recovery circuit according to claim 3, further including a low-pass filter connected in series between the loop filter and the voltage converter.

7. The clock data recovery circuit according to claim 4, further including a low-pass filter connected in series between the loop filter and the voltage converter.

8. The clock data recovery circuit according to the claim 5, further including a low-pass filter connected in series between the loop filter and the voltage converter.

9. A transceiver circuit wherein the phase comparator according to claim 1 is used in an operation for a phase comparison with input data.

10. A transceiver circuit wherein the phase comparator according to claim 2 is used in an operation for a phase comparison with input data.

* * * * *